(12) United States Patent
Sugimoto et al.

(10) Patent No.: US 10,524,363 B2
(45) Date of Patent: Dec. 31, 2019

(54) METHOD FOR PRODUCING WIRED CIRCUIT BOARD

(71) Applicant: NITTO DENKO CORPORATION, Osaka (JP)

(72) Inventors: Yuu Sugimoto, Osaka (JP); Hiroyuki Tanabe, Osaka (JP); Yoshito Fujimura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 266 days.

(21) Appl. No.: 15/628,059

(22) Filed: Jun. 20, 2017

(65) Prior Publication Data

US 2018/0007795 A1    Jan. 4, 2018

(30) Foreign Application Priority Data

Jul. 1, 2016   (JP) .................. 2016-132047

(51) Int. Cl.
| | | |
|---|---|---|
| *H05K 3/20* | (2006.01) | |
| *H05K 3/18* | (2006.01) | |
| *G03F 7/20* | (2006.01) | |
| *G03F 7/26* | (2006.01) | |
| *H05K 3/10* | (2006.01) | |

(52) U.S. Cl.
CPC ........... *H05K 3/184* (2013.01); *G03F 7/2002* (2013.01); *G03F 7/26* (2013.01); *H05K 3/108* (2013.01); *H05K 2203/0562* (2013.01); *H05K 2203/0759* (2013.01); *Y10T 29/49124* (2015.01); *Y10T 29/49128* (2015.01)

(58) Field of Classification Search
CPC ............... H01L 2224/03; H01L 24/19; H05K 2203/0562; H05K 3/108; H05K 2201/09272; H05K 3/184; H05K 3/064; H05K 3/4644; Y10T 29/49117; Y10T 29/49128; Y10T 29/49124
USPC .......................... 29/831, 825, 829, 846, 847
See application file for complete search history.

(56) References Cited

U.S. PATENT DOCUMENTS

| | | | | |
|---|---|---|---|---|
| 8,664,535 B2 * | 3/2014 | Kamei | ................. | H05K 1/0248 174/250 |
| 10,143,088 B2 * | 11/2018 | Sugimoto | ............. | G03F 7/2002 |
| 2014/0177106 A1 | 6/2014 | Shirafuji | | |

FOREIGN PATENT DOCUMENTS

JP            2014-127216 A      7/2014

\* cited by examiner

*Primary Examiner* — Thiem D Phan
(74) *Attorney, Agent, or Firm* — Edwards Neils LLC; Jean C. Edwards, Esq.

(57) ABSTRACT

A method includes the following steps: S1, providing the insulating layer having an inclined face; S4, disposing a photomask so that in the photoresist, first and second exposure portions are exposed to light, and exposing the photoresist is to light through the photomask; S5, removing the first and the second exposure portions of the photoresist. On the assumption that in S4, light reflected at the metal thin film is focused between the first and the second exposure portions of the photoresist, the inclined face has a bending portion bending in one direction, the portion removed in S5 in the photoresist due to light focus being continuous with the first and the second exposure portions. The second exposure portion includes continuously an avoidance portion that avoids the bending portion and an overlapping portion that overlaps with at least a portion other than the bending portion in the inclined face.

1 Claim, 17 Drawing Sheets

First embodiment

First embodiment
FIG. 2
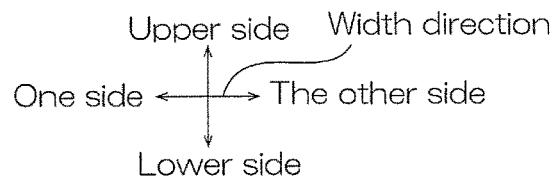
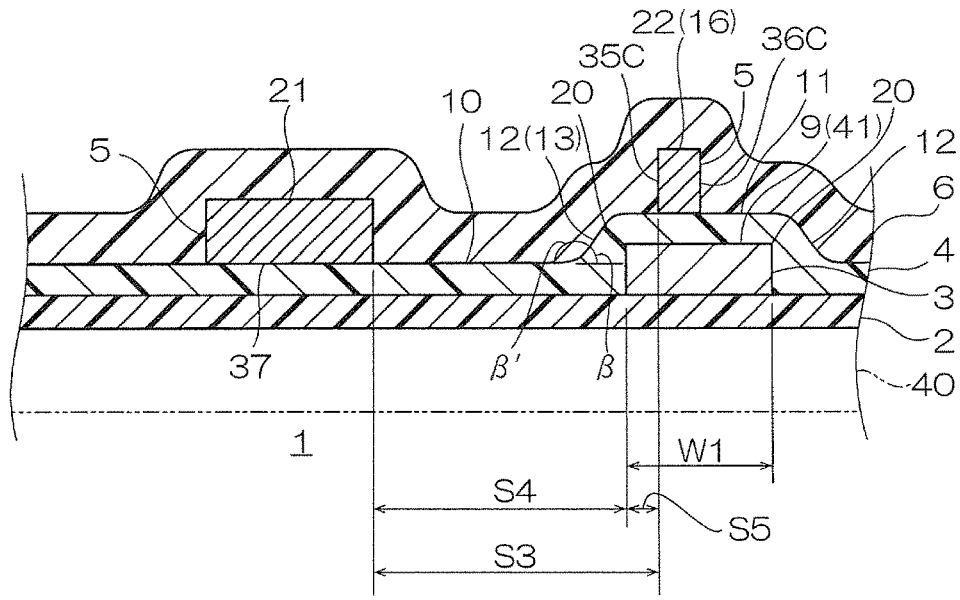
FIG. 3
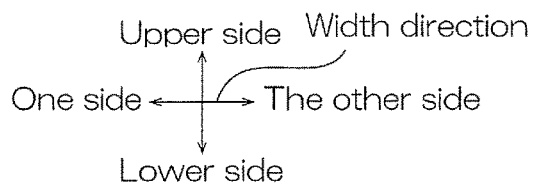
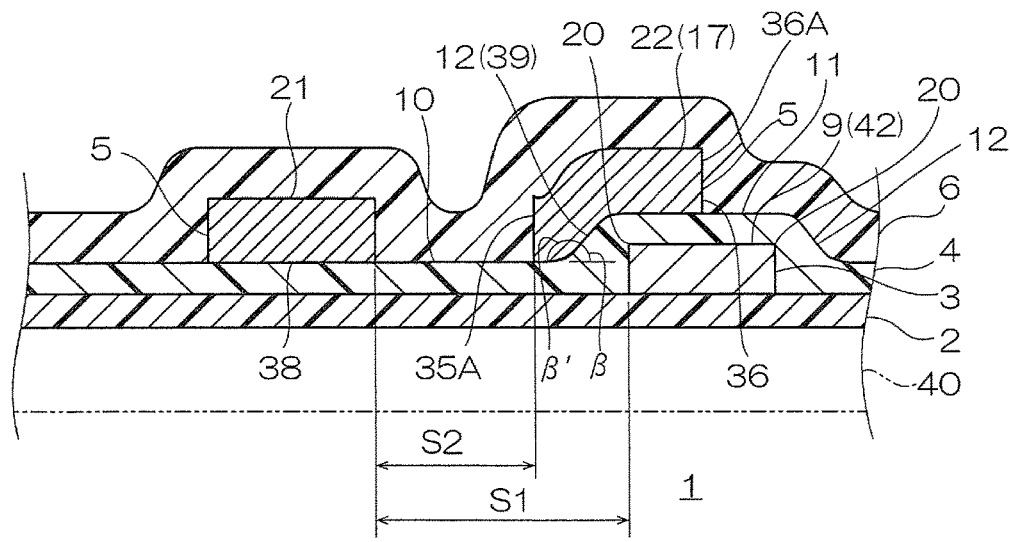

First embodiment
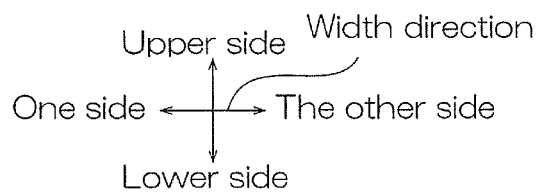
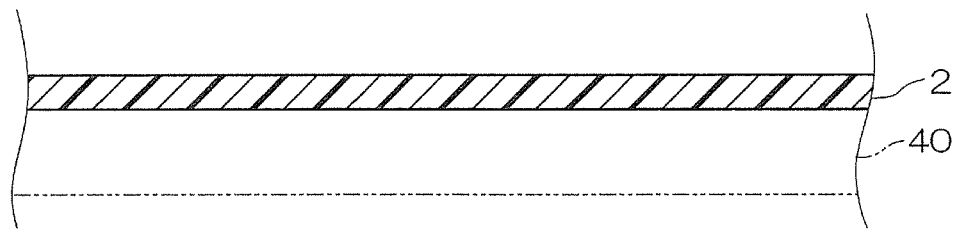
FIG. 4A
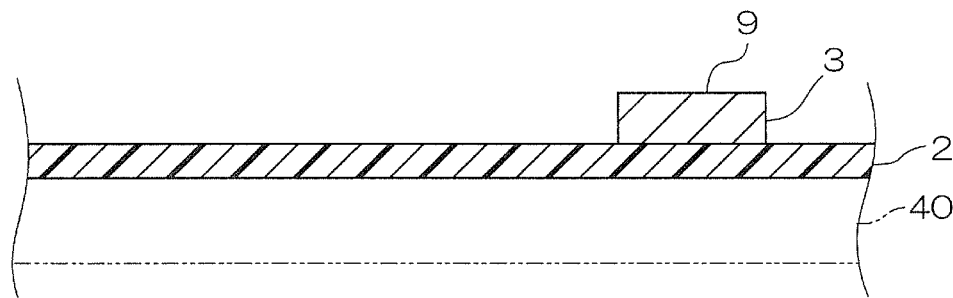
FIG. 4B
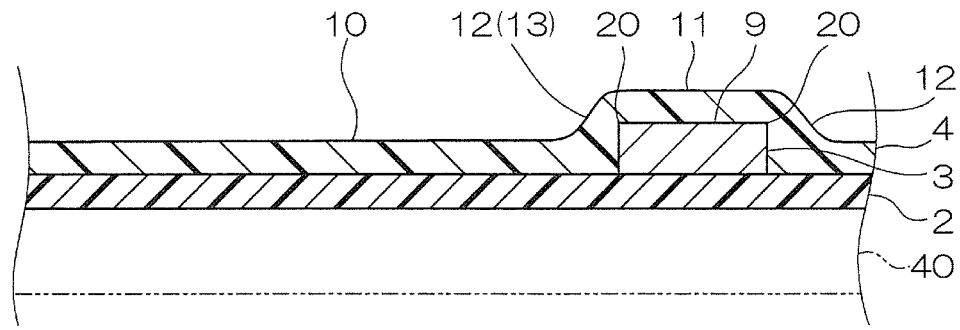
FIG. 4C
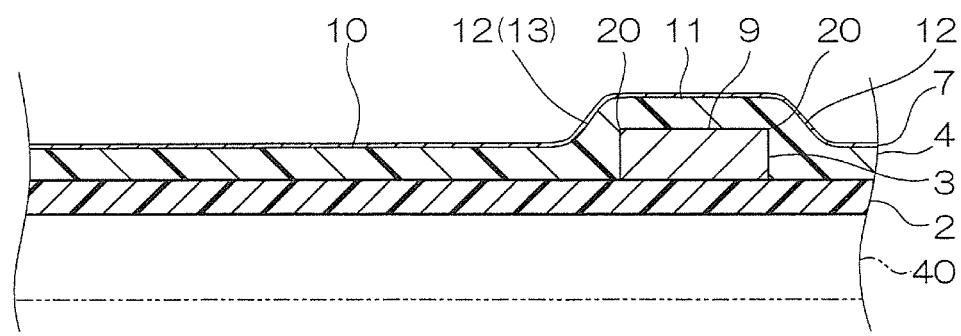
FIG. 4D First embodiment
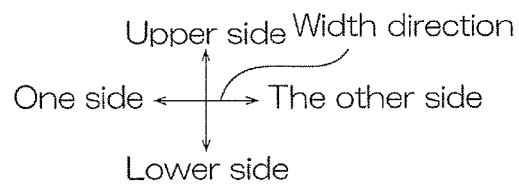
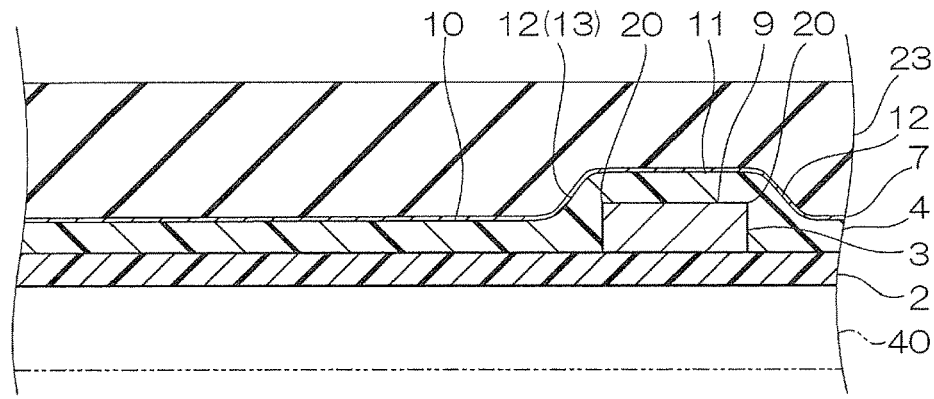
FIG. 5E
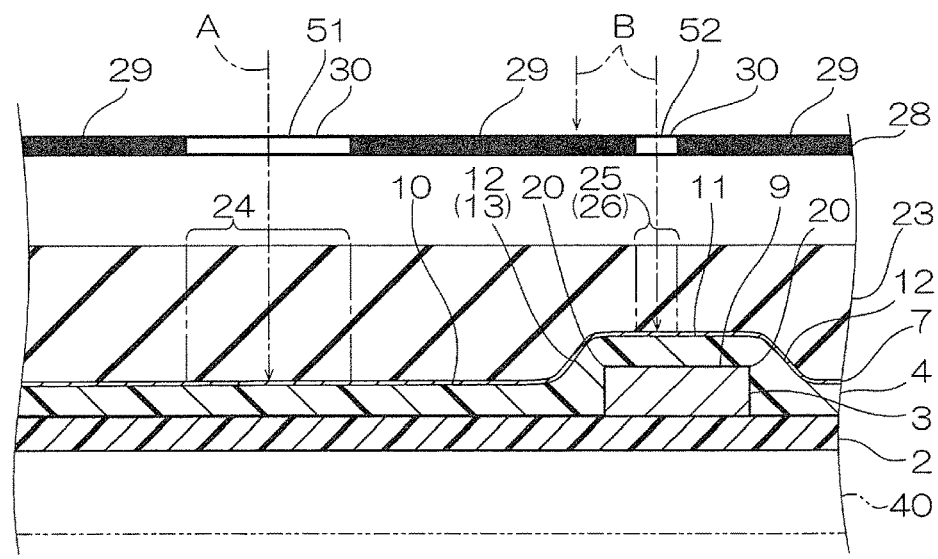
FIG. 5F
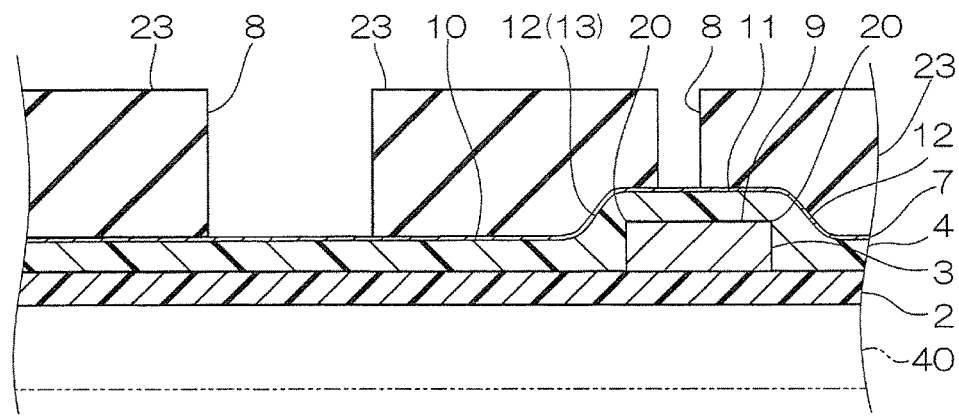
FIG. 5G

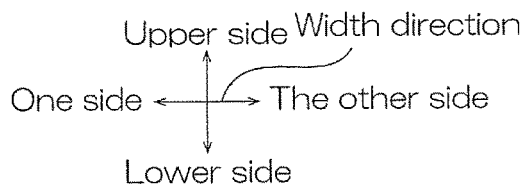
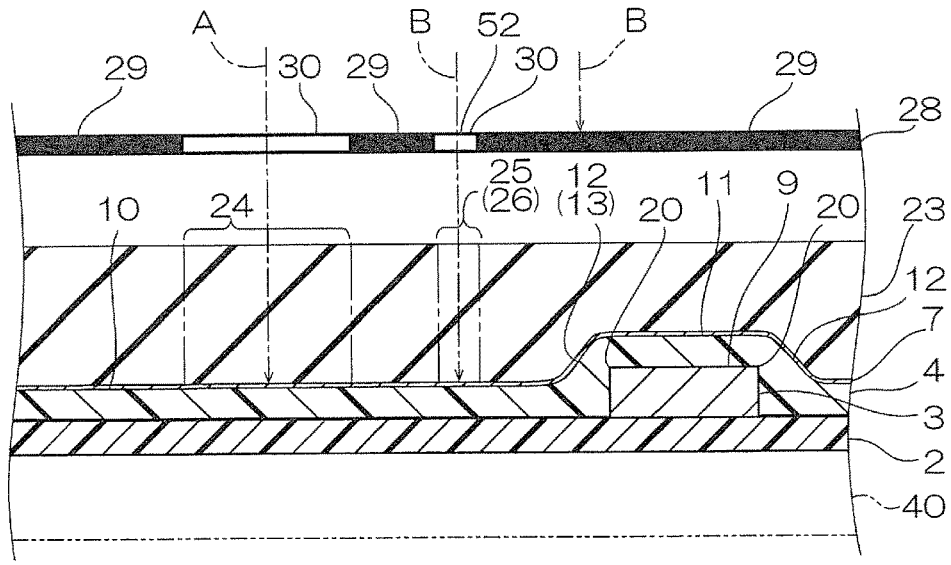
FIG. 8A Step (4)
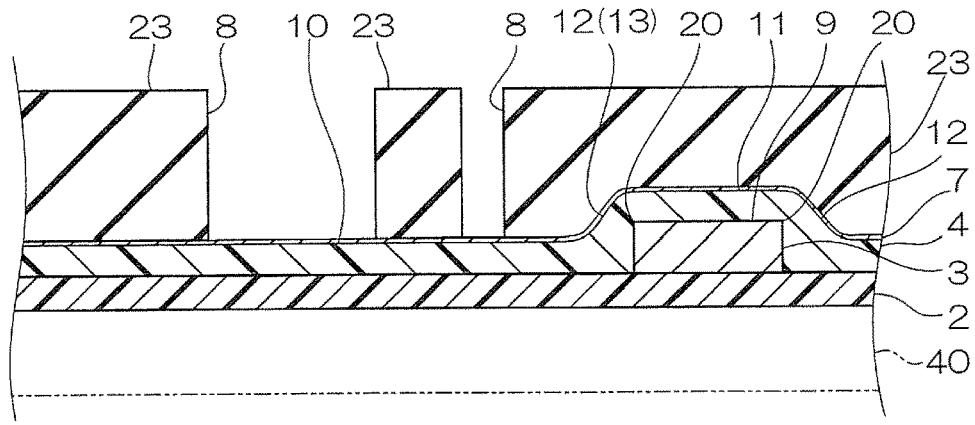
FIG. 8B Step (5)
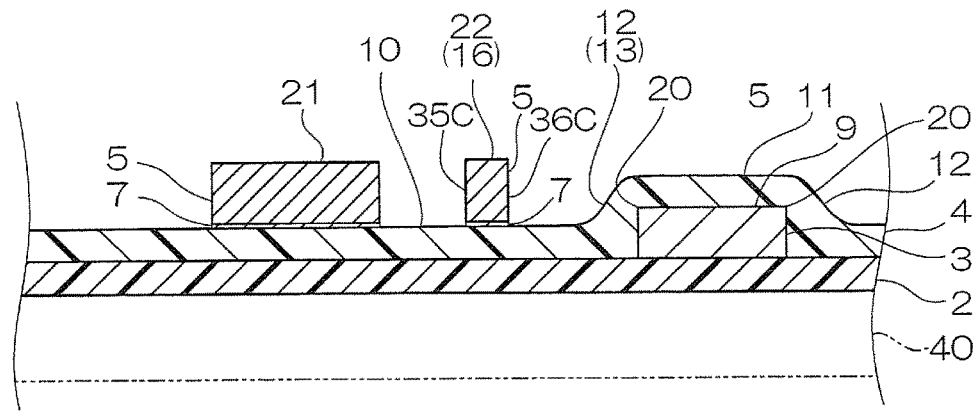
FIG. 8C Third embodiment

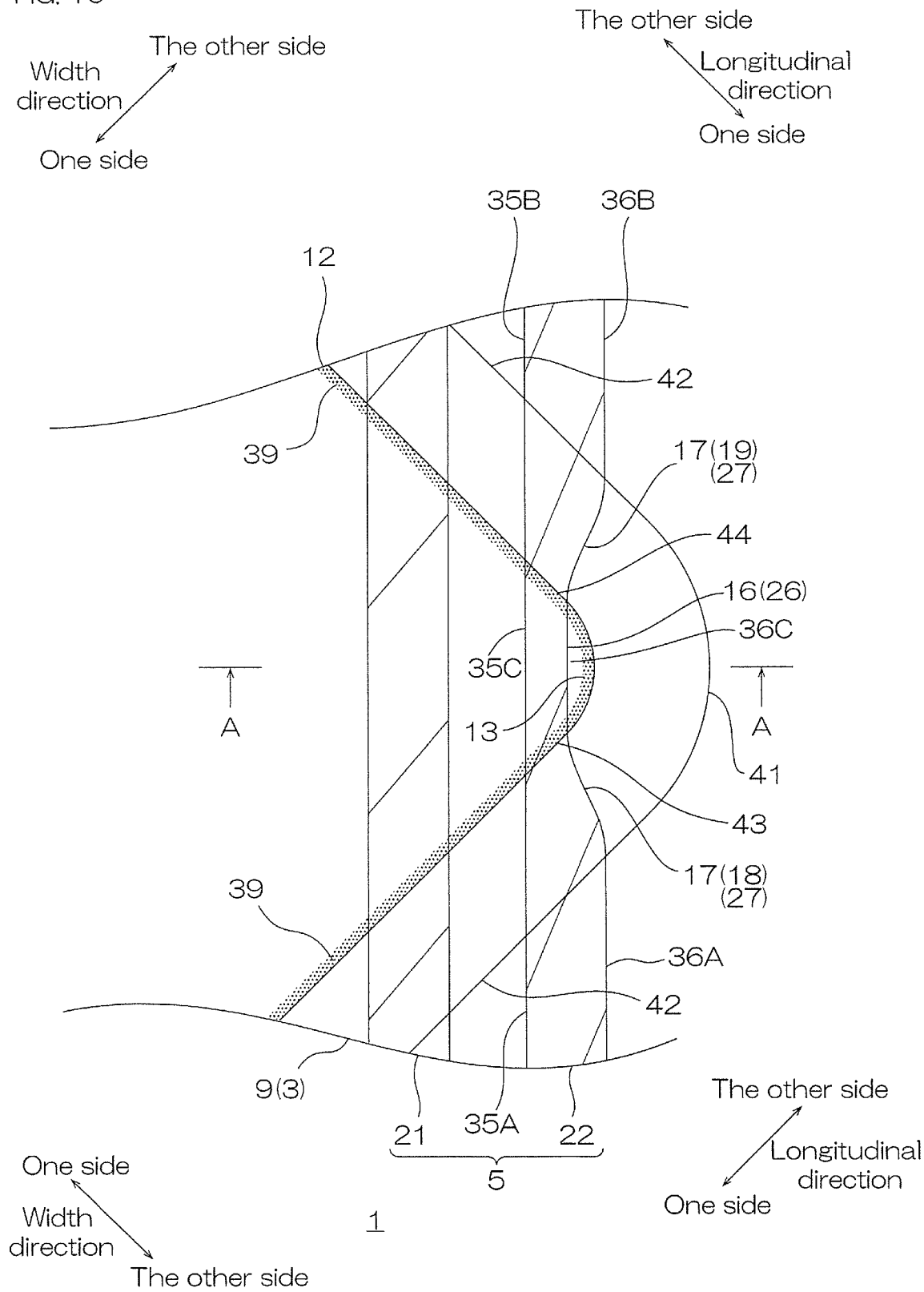

Fifth embodiment
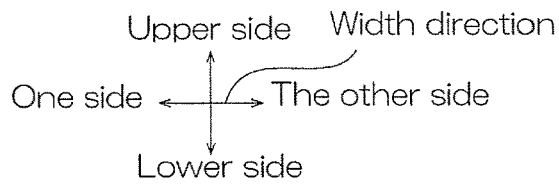
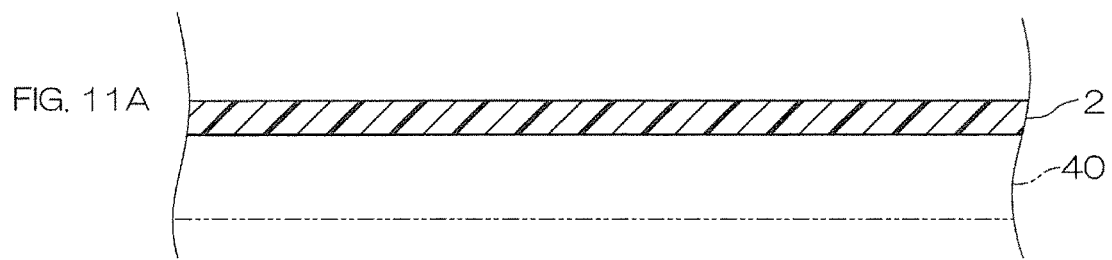
FIG. 11A
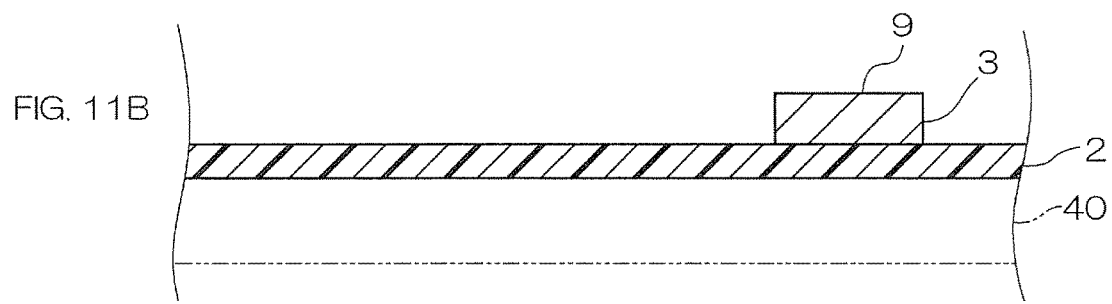
FIG. 11B
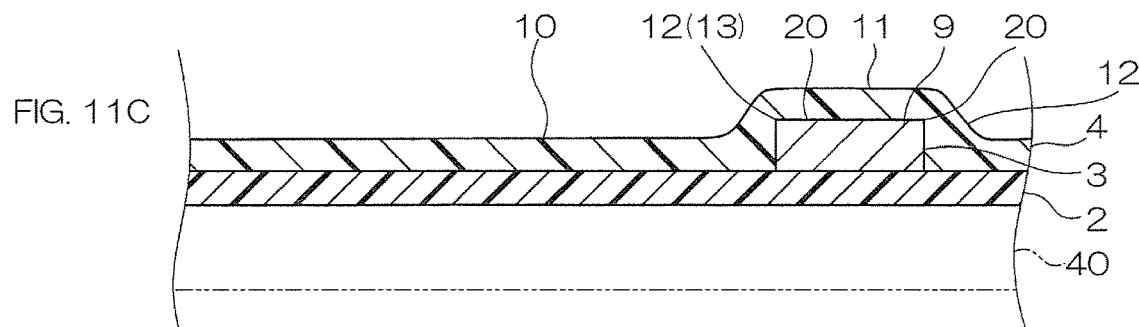
FIG. 11C
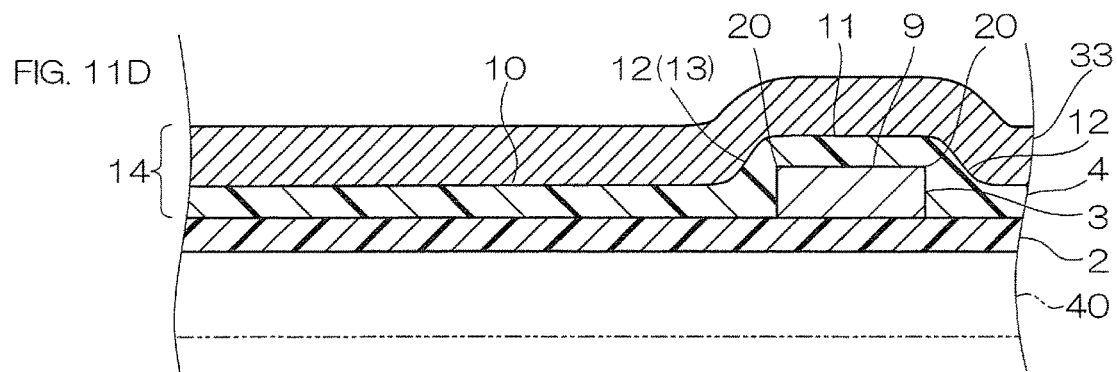
FIG. 11D Fifth embodiment Step (4)

Step (5)

Fifth embodiment
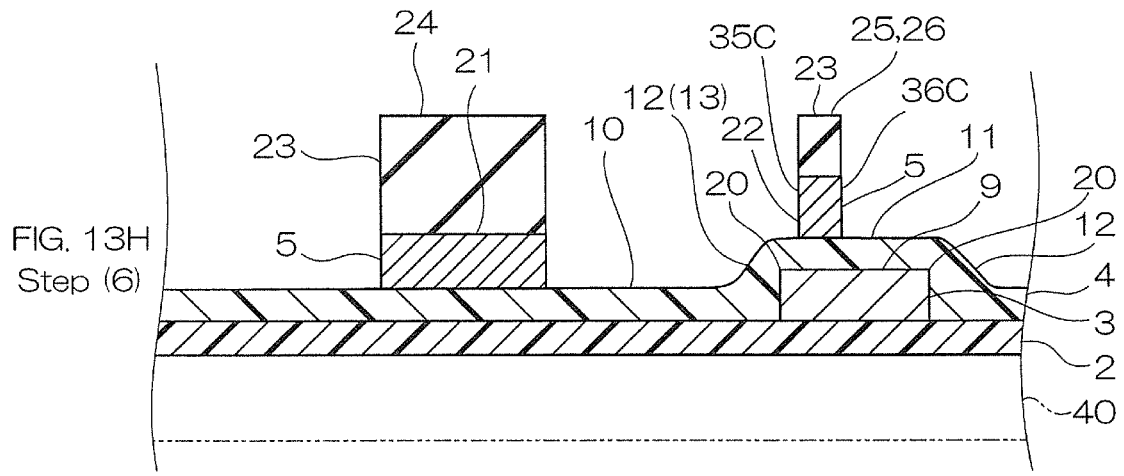
FIG. 13H Step (6)
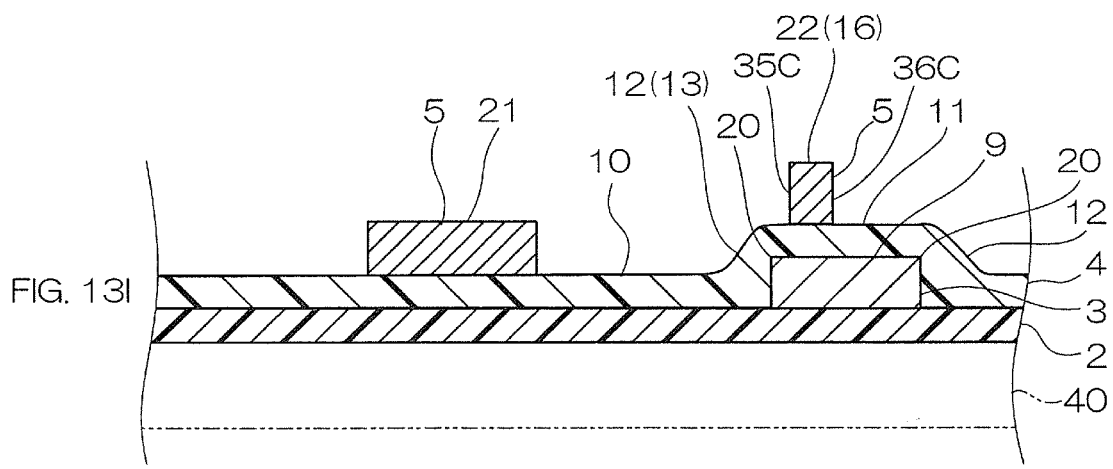
FIG. 13I
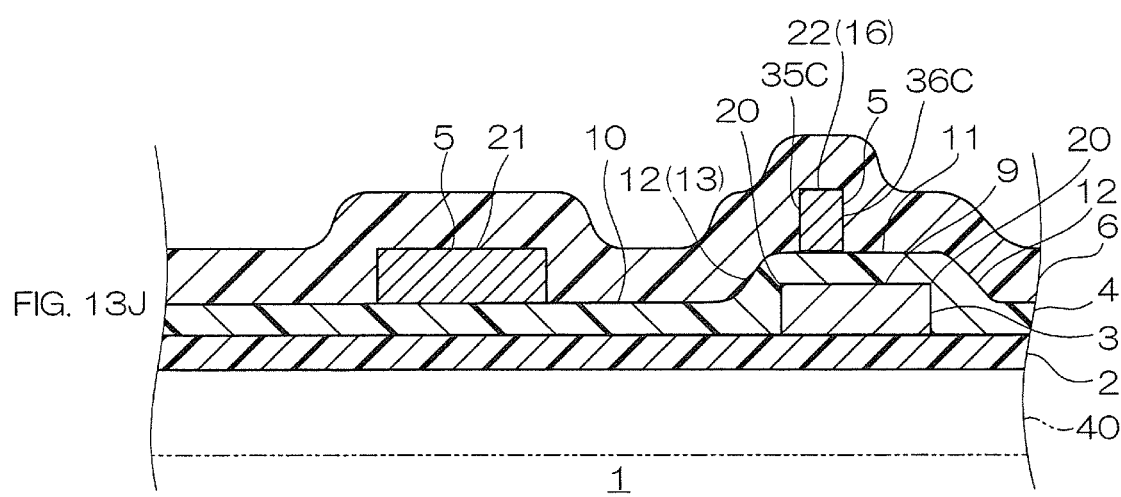
FIG. 13J Fifth embodiment Assumption 1

Assumption 1
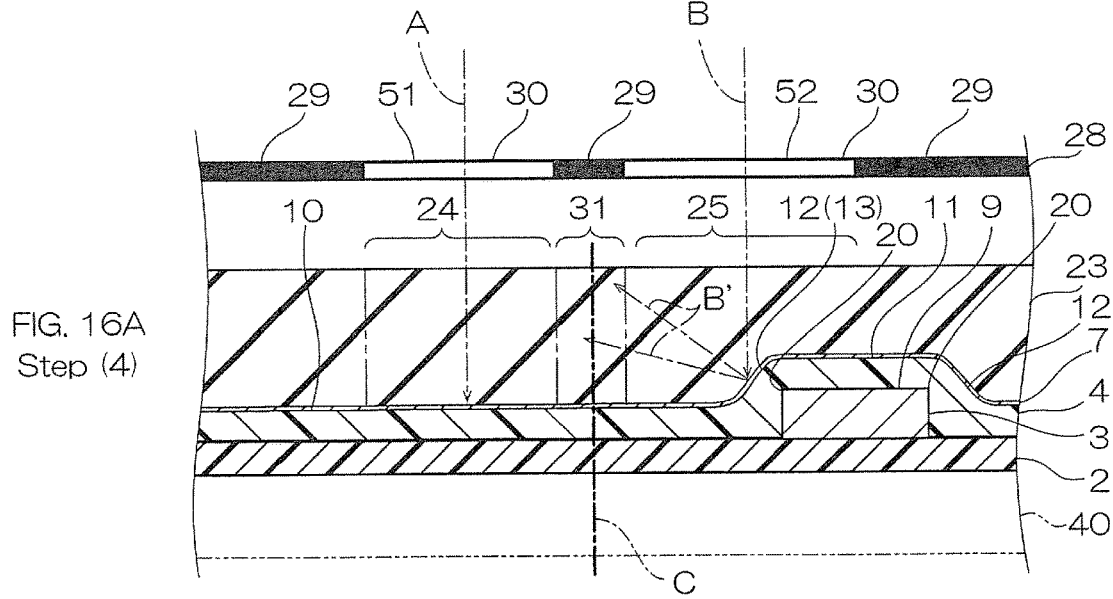
FIG. 16A Step (4)
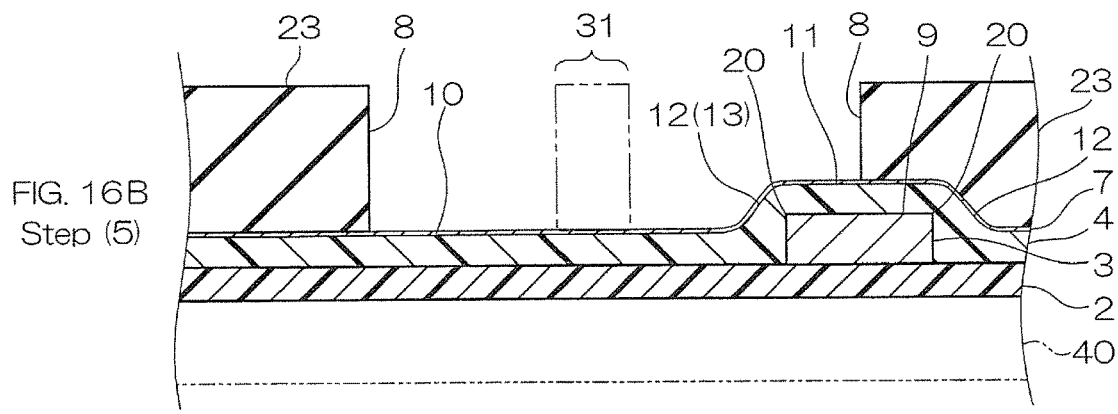
FIG. 16B Step (5)
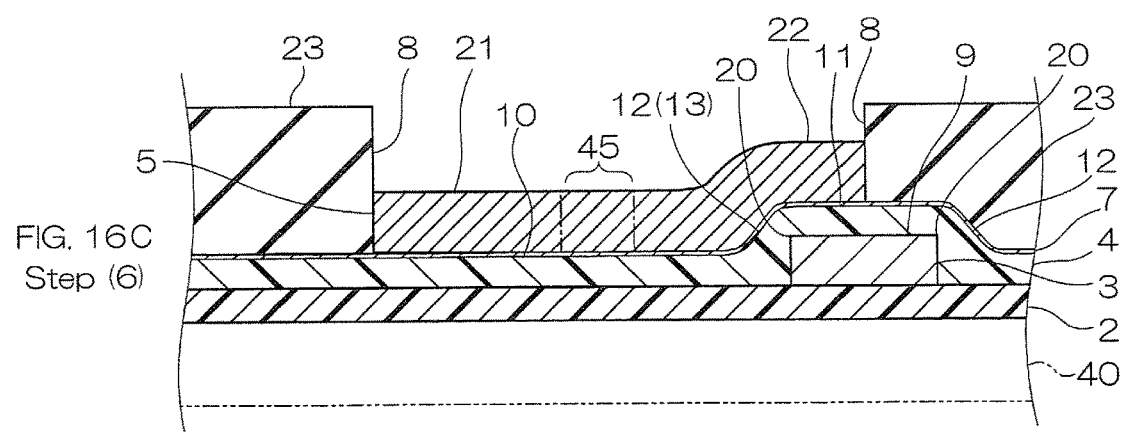
FIG. 16C Step (6)

Assumption 1

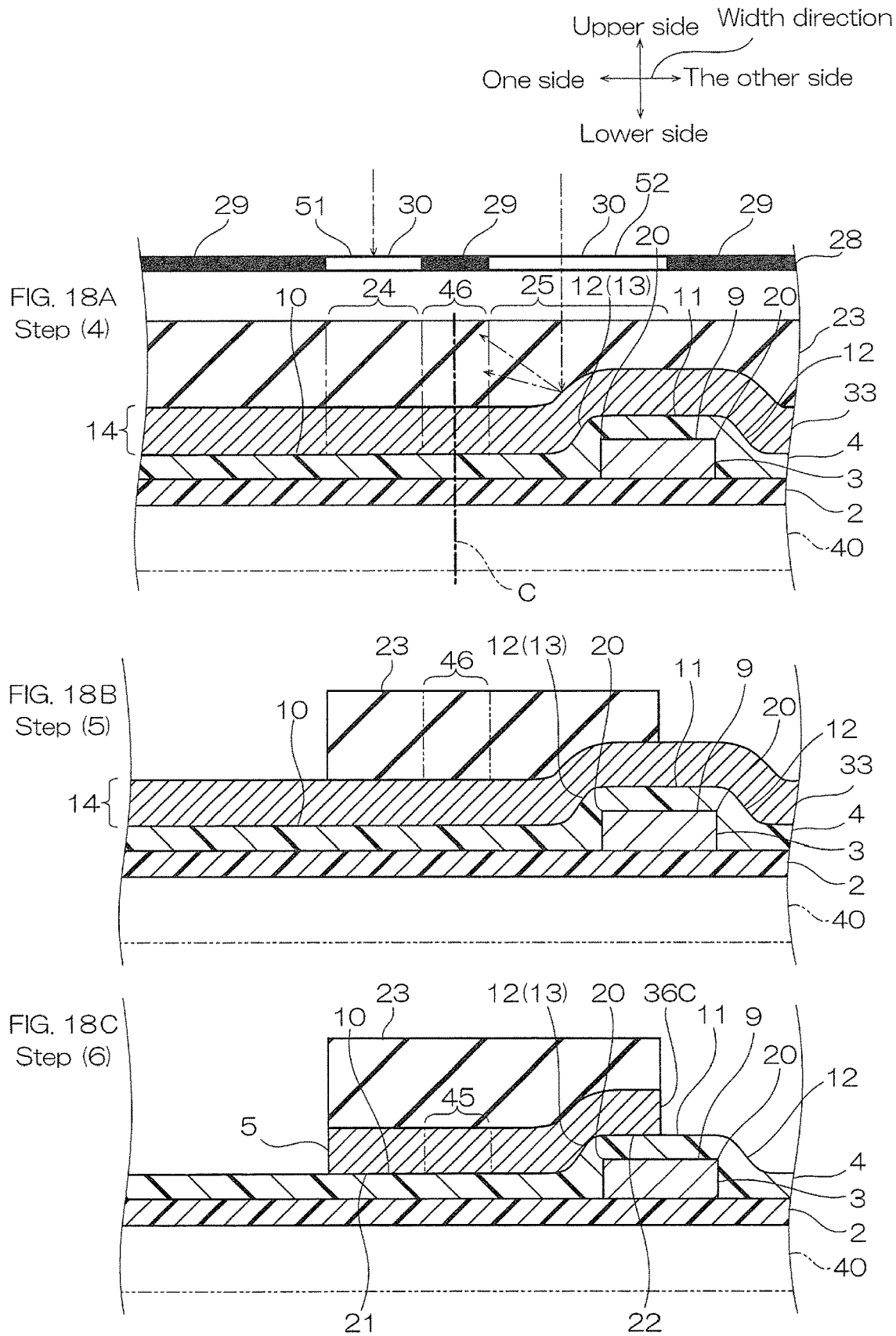

METHOD FOR PRODUCING WIRED CIRCUIT BOARD

CROSS REFERENCE TO RELATED APPLICATION

The present application claims priority from Japanese Patent Application No. 2016-132047 filed on Jul. 1, 2016, the contents of which are hereby incorporated by reference into this application.

BACKGROUND OF THE INVENTION

Field of the Invention

The present invention relates to a method for producing a wired circuit board.

Description of Related Art

For the method for producing a wired circuit board, a method in which an insulating layer is prepared, and thereafter, a wiring pattern is provided on the insulating layer has been known.

For example, Japanese Unexamined Patent Publication No. 2014-127216 has proposed a method for producing a suspension board with circuit which includes a step of forming a first portion having a first thickness and a second portion having a second thickness smaller than the first thickness in the insulating layer, and forming a wiring pattern so as to extend above the first portion and the second portion of the insulating layer.

In the production method described in Patent Document 1, in the step of forming a wiring pattern, the wiring pattern is formed on the top face of the insulating layer so that the boundary between the top face of the first portion and the boundary face extends in a first direction, the side of the wiring pattern extends in a second direction that crosses the first direction, and the second direction forms an angle of 60 degrees or more and 90 degrees or less relative to the first direction.

The boundary face is formed between the top face of the first portion and the top face of the second portion, and therefore in the step of forming a wiring pattern on the insulating layer by photolithography technique, reflection of exposed light at the boundary face is generated and the reflected light is indirectly applied to other region. However, with the method described in Patent Document 1, the exposure light is reflected at the boundary face in the direction close to the extension of the wiring pattern, and therefore the reflected light does not affect the original light exposure pattern. Thus, breaking or short circuit of the wiring pattern formed by photolithography technology is prevented.

SUMMARY OF THE INVENTION

Nowadays, when a small-sized wired circuit board is formed, the wiring pattern may be disposed in a complicated pattern. In such a case, the wiring pattern may not be formed as in Japanese Unexamined Patent Publication No. 2014-127216, i.e., the second direction forms an angle of 60 degrees or more and 90 degrees or less relative to the first direction. In such a case, there are disadvantages such as the following. The short circuit between the wiring patterns may not be prevented.

An object of the present invention is to provide a method for producing a wired circuit board, in which a first wiring and a second wiring are provided highly freely and short circuit between them can be prevented.

The present invention (1) includes a method for producing a wired circuit board including an insulating layer, and a first wiring and a second wiring next to each other in spaced-apart relation, the method including the steps of:

a step 1, in which the insulating layer having an inclined face is provided;

a step 2, in which a metal thin film is provided on the surface of the insulating layer;

a step 3, in which a photoresist is provided on the surface of the metal thin film;

a step 4, in which a photomask is disposed so that in the photoresist, a first exposure portion corresponding to the first wiring and a second exposure portion corresponding to the second wiring are exposed to light, and the photoresist is exposed to light through the photomask, a step 5, in which the first exposure portion and the second exposure portion of the photoresist are removed to allow the metal thin film corresponding to the first exposure portion and the second exposure portion to expose, and a step 6, in which the first wiring and the second wiring are provided on the surface of the metal thin film, wherein on the assumption that in the step 4, the reflected light reflected at the metal thin film is focused between the first exposure portion and the second exposure portion of the photoresist, the inclined face has a bending portion bending in one direction when viewed from the top, such that the portion removed in the step 5 in the photoresist due to light focus is continuous with the first exposure portion and the second exposure portion; and the second exposure portion includes continuously an avoidance portion that avoids the bending portion and an overlapping portion that overlaps with at least a portion other than the bending portion in the inclined face when viewed from the top.

The following assumption is considered: as shown in FIG. 15 and FIG. 16A, in the step 4, the reflected light B' reflected at the metal thin film 7 is focused between the first exposure portion 24 and the second exposure portion 25 of the photoresist 23. The reflected light B' is produced, in the step 4, by reflection of light B at the metal thin film 7 corresponding to the insulating inclined face curve portion 13. Then, as shown in FIG. 16B, it reaches an assumedly removed portion 31 that is continuous with the first exposure portion 24 and the second exposure portion 25 of the photoresist 23, when viewed in cross section. Also, as shown in the arrow in FIG. 15, the insulating inclined face curve portion 13 is bent in one direction when viewed from the top, and therefore the reflected light B' produced at the metal thin film 7 corresponding to the insulating inclined face curve portion 13 is headed to the assumedly removed portion 31 when viewed from the top.

Therefore, as shown in FIG. 16B, in the step 5, the assumedly removed portion 31 of the photoresist 23 does not remain and is removed. Then, as shown in FIG. 16C and FIG. 17, in the step 6, a short circuit portion 45 connecting the first wiring 21 and the second wiring 22 is produced, to form an upper conductor pattern 5 having the short circuit portion 45.

However, with the production method of the present invention (1), the second exposure portion has an avoidance portion that avoids the bending portion when viewed from the top. In the step 4, the photoresist is exposed to light through a photomask so as to shield the photoresist corresponding to the inclined face from light, and therefore no reflected light such as the one shown in FIG. 16A is produced, i.e., the light reflected at the metal thin film corresponding to the bending portion. Therefore, in the step 5, production of the portion (assumedly removed portion) caused by the above-described light focus can be prevented. As a result, generation of the short circuit portion caused by the above-described light focus can be prevented. As a result, the short circuit between the first wiring and the second wiring can be prevented.

Furthermore, with the method of the present invention (1), the second wiring can be provided highly freely as long as the second exposure portion includes the avoidance portion and the overlapping portion.

The present invention (2) includes a method for producing a wired circuit board including an insulating layer, and a first wiring and a second wiring next to each other in spaced-apart relation, the method including the steps of:

a step 1, in which the insulating layer having an inclined face is provided, a step 2, in which a conductor layer is provided on the surface of the insulating layer, a step 3, in which a photoresist is provided on the surface of the conductor layer, a step 4, in which a photomask is disposed so that a first exposure portion corresponding to the first wiring and a second exposure portion corresponding to the second wiring of the photoresist are exposed to light, and the photoresist is exposed to light through the photomask, a step 5, in which the portion other than the first exposure portion and the second exposure portion of the photoresist is removed to expose the conductor layer from the first exposure portion and the second exposure portion, and a step 6, in which the conductor layer exposed from the first exposure portion and the second exposure portion is removed to form the first wiring and the second wiring, wherein on the assumption that, in the step 4, light reflected at the conductor layer is focused between the first exposure portion and the second exposure portion of the photoresist, the inclined face has a bending portion bending in one direction when viewed from the top, such that the portion remaining in the step 5 by the light focus in the photoresist being continuous with the first exposure portion and the second exposure portion; and the second exposure portion includes continuously an avoidance portion that avoids the bending portion and an overlapping portion that overlaps with at least a portion other than the bending portion in the inclined face when viewed from the top.

The following assumption is considered: as shown in FIG. 15 and FIG. 18A, in the step 4, the reflected light B' reflected at the conductor layer 33 is focused between the first exposure portion 24 and the second exposure portion 25 of the photoresist 23. The reflected light B' is produced, in the step 4, by reflection of light B at the conductor layer 33 corresponding to the insulating inclined face curve portion 13. Then, as shown in FIG. 18B, when viewed in cross section, it reaches the assumedly remained portion 46 that is continuous with the first exposure portion 24 and the second exposure portion 25 of the photoresist 23. Furthermore, as shown in the arrows of FIG. 15, the insulating inclined face curve portion 13 is bent in one direction when viewed from the top, and therefore the reflected light B' produced at the conductor layer 33 corresponding to the insulating inclined face curve portion 13 is headed to the assumedly remained portion 46 when viewed from the top.

Therefore, as shown in FIG. 18B, in the step 5, the assumedly remained portion 46 of the photoresist 23 is not removed and does remain. Then, as shown in FIG. 17 and FIG. 18C, in the step 6, a short circuit portion 45 connecting the first wiring 21 and the second wiring 22 is produced, forming an upper conductor pattern 5 having the short circuit portion 45.

However, with the method of the present invention (2), the second exposure portion has an avoidance portion that avoids the bending portion when viewed from the top. In the step 4, the photoresist is exposed to light through the photomask so as to shield the photoresist corresponding to the inclined face from light, and therefore reflected light reflected at the conductor layer corresponding to the bending portion as shown in FIG. 18A is not produced. Therefore, production of the short circuit portion caused by the above-described light focus can be prevented. As a result, the short circuit between the first wiring and the second wiring can be prevented.

With the production method of the present invention (2), the second wiring can be provided highly freely as long as the second exposure portion includes the avoidance portion and the overlapping portion.

With the method for producing a wired circuit board of the present invention, the first wiring and the second wiring can be provided highly freely, and their short circuit can be prevented.

BRIEF DESCRIPTION OF THE DRAWINGS

FIG. 1 shows a first light transmissive portion and a second light transmissive portion in the photomask disposed in the step 4 in parenthesis. Furthermore, FIG. 1 shows a first exposure portion and a second exposure portion produced in the photoresist in the step 4 in parenthesis.

FIG. 2 shows a cross-sectional view crossing the are portion and the inclined face overlapping avoidance portion along the width direction (line A-A) of the lower wiring shown in FIG. 1.

FIG. 3 shows a cross-sectional view crossing the linear portion and the inclined face overlapping portion along the width direction (line B-B) of the lower wiring shown in FIG. 1.

FIG. 4A to FIG. 4D show a portion of the process diagram for the method for producing a wired circuit board shown in FIG. 2, FIG. 4A illustrating a step i, in which an insulating base layer is provided, FIG. 4B illustrating a step ii, in which a lower conductor pattern is provided, FIG. 4C illustrating a step 1, in which an intermediate insulating layer is provided, and FIG. 4D illustrating a step 2, in which a metal thin film is provided.

FIG. 5E to FIG. 5G show, following FIG. 4D, a portion of the process diagram for the method for producing a wired circuit board shown in FIG. 2, FIG. 5E illustrating a step 3, in which a photoresist is provided, FIG. 5F illustrating a step 4, in which the photoresist is exposed to light, and FIG. 5G illustrating a step 5, in which a first exposure portion and a second exposure portion are removed.

FIG. 8A to FIG. 8C show a portion of the process diagram for the method for producing a wired circuit board shown in FIG. 7, FIG. 8A illustrating a step 4, in which a photoresist is exposed to light, FIG. 8B illustrating a step 5, in which a first exposure portion and a second exposure portion are removed, and FIG. 8C illustrating a step 6, in which an upper conductor pattern is provided.

FIG. 10 shows an enlarged plan view of the arc portion and the inclined face overlapping avoidance portion of the wired circuit board produced in the fourth embodiment of the method for producing a wired circuit board of the present invention (embodiment in which the first wiring and the second wiring have a generally linear shape when viewed from the top).

FIG. 11A to FIG. 11D show a portion of the process diagram of the fifth embodiment of the method for producing a wired circuit board of the present invention, FIG. 11A illustrating a step i, in which an insulating base layer is prepared, FIG. 11B illustrating a step ii, in which a lower conductor pattern is provided, FIG. 11C illustrating a step 1, in which an intermediate insulating layer is provided, and FIG. 11D illustrating a step 2, in which a conductor layer is provided.

FIG. 13H to FIG. 13J show, following FIG. 12G, a portion of the process diagram for the method for producing a wired circuit board in the fifth embodiment of the present invention, FIG. 13H illustrating a step 6, in which the conductor layer exposed from the first exposure portion and the second exposure portion is removed, FIG. 13I illustrating a step iii, in which the first exposure portion and a second exposure portion are removed, and FIG. 13J illustrating a step v, in which an insulating cover layer is provided.

In FIG. 15, an assumedly removed portion, first exposure portion, and a second exposure portion produced in the step 4 are also shown in parenthesis.

FIG. 16A to FIG. 16C show production process diagram of a step 4 to a step 6, in a method for producing wired circuit board on the assumption, FIG. 16A illustrating a step 4, in which a photoresist is exposed to light to produce an assumedly removed portion, a first light transmissive portion, and a second light transmissive portion, FIG. 16B illustrating a step 5, in which the assumedly removed portion, the first light transmissive portion, and the second light transmissive portion are removed, and FIG. 16C illustrating a step 6, in which an upper conductor pattern having a short circuit portion is provided.

In FIG. 17, the assumedly removed portion, first light transmissive portion, and second light transmissive portion produced in the photoresist are also shown in parenthesis.

FIG. 18A to FIG. 18C show a portion of the process diagram for the method for producing a wired circuit board on the assumption, in which the second wiring has no inclined face overlapping avoidance portion, FIG. 18A illustrating a step 4, in which the photoresist is exposed to light to produce an assumedly remained portion, a first light transmissive portion, and a second light transmissive portion, FIG. 18B illustrating a step 5, in which the portion other than the assumedly remained portion, the first light transmissive portion, and the second light transmissive portion in the photoresist is removed, and FIG. 18C illustrating a step 6, in which an upper conductor pattern having a short circuit portion is provided.

DETAILED DESCRIPTION OF THE INVENTION

The wired circuit board produced by the method for producing a wired circuit board of the present invention includes a single layer or a plurality of layers of the conductor pattern, and its layer structure is not particularly limited. The wired circuit board includes a suspension board with circuit including a metal supporting board, and a flexible wired circuit board having no metal supporting board.

First Embodiment

In the following, the method for producing a wired circuit board in the first embodiment of the present invention, and a wired circuit board produced by that method are described with reference to figures.

Figure 1:
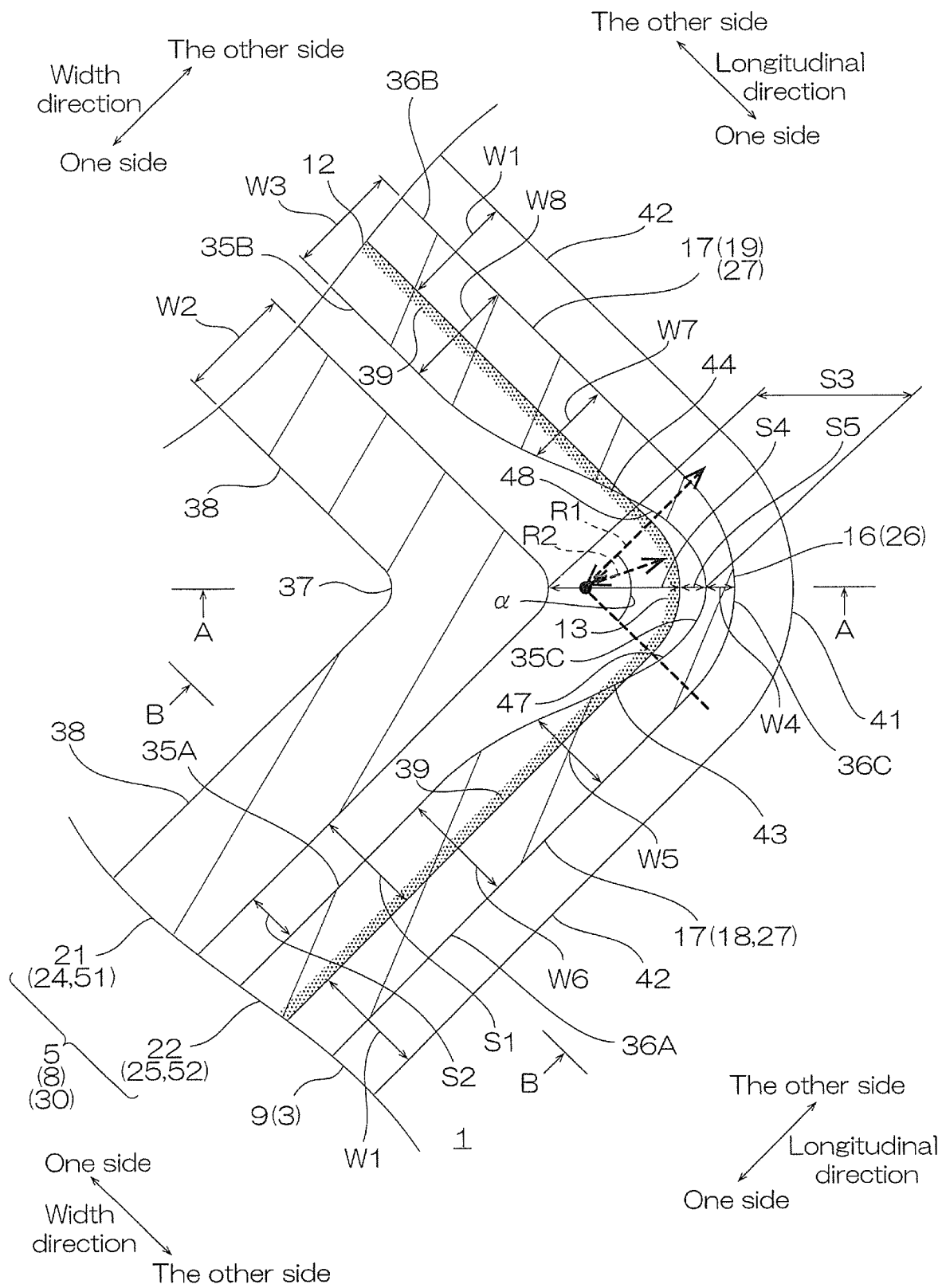
FIG. 1 shows an enlarged plan view of an are portion and an inclined face overlapping avoidance portion of the wired circuit board (embodiment in which two linear portions are provided per one arc portion in lower wiring, and the inclined face overlapping avoidance portion is positioned at one side in the width direction of the insulating inclined face curve portion) produced in the first embodiment of the method for producing a wired circuit board of the present invention.

In FIG. 1, the direction in which the lower wiring extends is referred to as longitudinal direction (first direction). The lower side in the plane of the sheet is referred to as longitudinal one side (one side in first direction), and the upper side in the plane of the sheet is referred to as the longitudinal other side (other side in first direction).

In FIG. 1, the direction perpendicular to the longitudinal direction is referred to as width direction of the lower wiring (second direction perpendicular to the first direction). The left side in the plane of the sheet is one side in the width direction (one side in second direction), and the right side in the plane of the sheet is the other side in width direction (the other side in second direction).

In FIG. 1, paper thickness direction in the plane of the sheet is up-down direction (third direction perpendicular to the first direction and the second direction, thickness direction). The near side in the plane of the sheet is upper side (one side in the third direction, one side in the thickness direction), and further side in the plane of the sheet is lower side (the other side in the third direction, the other side in the thickness direction).

The directions are, to be specific, in accordance with the direction arrows in the figures.

In FIG. 1, FIG. 7, FIG. 9, and 10, the insulating base layer 2, the intermediate insulating layer 4 and the insulating cover layer 6 are omitted to clearly show the relative position of the lower conductor pattern 3 and the upper conductor pattern 5 to be described later. However, only the inclined face 12 at one side in the width direction of the intermediate insulating layer 4 is shown in dotted hatching.

1. Wired Circuit Board

A wired circuit board 1 has a generally flat plate (sheet) shape extending in longitudinal direction. As shown in FIGS. 2 and 3, the wired circuit board 1 includes an insulating base layer 2, a lower conductor pattern 3 provided on the insulating base layer 2, an intermediate insulating layer 4 as an example of the insulating layer provided on the insulating base layer 2 and covering the lower conductor pattern 3, an upper conductor pattern 5 disposed on the intermediate insulating layer 4, and an insulating cover layer 6 provided on the intermediate insulating layer 4 and covering the upper conductor pattern 5.

1-1. Insulating Base Layer

The insulating base layer 2 is the lowermost layer of the wired circuit board 1. The insulating base layer 2 has a generally flat plate (sheet) shape extending in longitudinal direction. The insulating base layer 2 is made of an insulating material. Examples of the insulating material include synthetic resins such as polyimide resin, polyamide-imide resin, acrylic resin, polyether resin, nitrile resin, polyether sulfone resin, polyethyleneterphthalate resin, polyethylenenaphthalate resin, and polyvinyl chloride resin, and preferably, polyimide resin is used. The insulating base layer 2 has a thickness of, for example, 1 μm or more, preferably 3 μm or more, and for example, 25 μm or less, preferably 15 μm or less.

1-2. Lower Conductor Pattern

The lower conductor pattern 3 is a conductor pattern positioned at the lower side, of the lower conductor pattern 3 and the upper conductor pattern 5. The lower conductor pattern 3 is the conductor pattern positioned at the lower side of the intermediate insulating layer 4. The lower conductor pattern 3 is positioned at the top face of the insulating base layer 2. The lower conductor pattern 3 integrally includes a lower wiring 9, and a first terminal (not shown) continued to both ends in the longitudinal direction of the lower wiring 9.

As shown in FIG. 1, the lower wiring 9 partially has a generally letter L shape at when viewed from the top. To be specific, the lower wiring 9 integrally includes an arc portion 41 having an arc shape when viewed from the top, and two linear portions 42 continuing to the both ends in longitudinal direction of the arc portion 41.

The arc portion 41 has a generally arc shape when viewed from the top, the longitudinal center portion in the arc portion 41 projecting towards the other side in width direction relative to the longitudinal direction both end portions. The arc portion 41 is bent gradually toward one side in the width direction as it approaches towards the longitudinal other side. The radius (radius of curvature) R1 of the virtual circle (to be specific, virtual circle of curvature along the widthwise center of the arc portion 41) along the arc portion 41 is, for example, 5 μm or more, preferably 15 μm or more, and for example, 300 μm or less, preferably 100 μm or less. The central angle α of the arc portion 41 is not particularly limited, and for example, more than 0 degree, preferably 30 degrees or more, more preferably 45 degrees or more, and for example, less than 90 degrees, preferably 75 degrees or less.

Two linear portions 42 are disposed so that their extensions cross each other. Of the two linear portions 42, the linear portion 42 positioned at longitudinal one side extends in longitudinal one side from longitudinal one end edge to longitudinal one side of the arc portion 41 when viewed from the top (means "in the projection plane projecting in the thickness direction", the same applies to the following as well). The linear portion 42 positioned at the longitudinal other side extends from the other end edge in longitudinal direction of the arc portion 41 when viewed from the top (means "in the projection plane projecting in the thickness direction", the same applies to the following as well).

As shown in FIGS. 2 and 3, the lower wiring 9 (arc portion 41 (FIG. 2) and the two linear portions 42 (FIG. 3)) have a generally rectangular shape when viewed in cross section. The lower wiring 9 has two ridgeline portions 20 at the upper end portion in width direction of its both end edge.

The lower conductor pattern 3 has a thickness of, for example, 1 μm or more, preferably 3 μm or more, and for example, 20 μm or less, preferably 12 μm or less. The lower wiring 9 has a width W1 of, for example, 5 μm or more, preferably 8 μm or more, and for example, 200 μm or less, preferably 100 μm or less.

1-3. Intermediate Insulating Layer

The intermediate insulating layer 4 is a layer positioned in the middle, of the insulating base layer 2, the intermediate insulating layer 4, and the insulating cover layer 6, and is a layer sandwiched by the insulating base layer 2 and the insulating cover layer 6. The intermediate insulating layer 4 is disposed on the top face of the insulating base layer 2 so as to cover the side face and the top face of the lower conductor pattern 3. Although not shown, the intermediate insulating layer 4 allows the first terminal (not shown) of the lower conductor pattern 3 to expose.

The intermediate insulating layer 4 has atop face including a first flat face 10, a second flat face 11, and an inclined face 12.

The first flat face 10 is disposed above the insulating base layer 2 that does not overlap with the lower conductor pattern 3 in spaced-apart relation to face the insulating base layer 2. The first flat face 10 is a face parallel to the surface direction (direction along the top face of the insulating base layer 2, that is, direction along the longitudinal direction and the width direction).

The second flat face 11 corresponds to the top face of the lower wiring 9. To be specific, the second flat face 11 is disposed above the top face of the lower wiring 9 to face the lower wiring 9 in spaced-apart relation. The second flat face 11 connects the upper end portion of the two inclined faces 12 to be described next. The second flat face 11 is in parallel with the first flat face 10.

The inclined face 12 corresponds to the lower wiring 9. The inclined face 12 is continuous with the first flat face 10 and the second flat face 11. The inclined face 12 is a face that is inclined relative to the surface direction. To be specific, the inclined face 12 is provided in correspondence with the two ridgeline portions 20 of the lower wiring 9, and is a face inclining (rising) from the first flat face 10 upwards and then reaches the both end portions in width direction of the second flat face 11.

The supplementary angle β to the angle β' formed between the inclined face 12 and the first flat face 10, that is, the gradient β of the inclined face 12 relative to the first flat face 10 is, for example, 5 degrees or more, preferably 20 degrees or more, and for example, less than 90 degrees, preferably 60 degrees or less.

Figure 15:
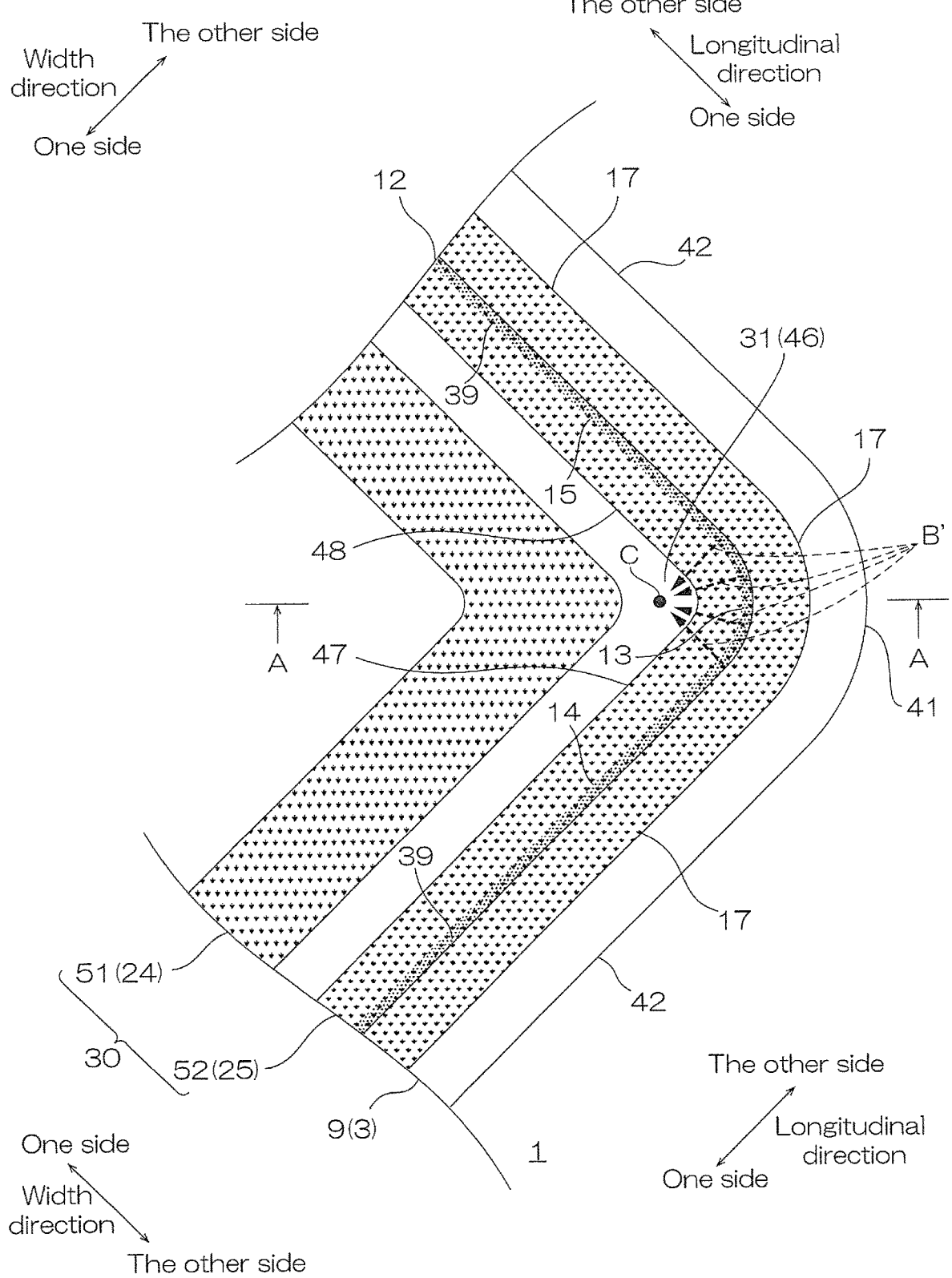
FIG. 15 shows an enlarged plan view of the first light transmissive portion and the second light transmissive portion of the photomask in the step 4 of the method for producing a wired circuit board on the assumption, in which the second wiring has no inclined face overlapping avoidance portion.

As shown in FIG. 1, the inclined face 12 positioned at one side in the width direction continuously has two insulating inclined face linear portions 39 (ref: FIG. 1 and FIG. 3) corresponding to the two linear portions 42 of the lower wiring 9, and the insulating inclined face curve portion 13 (ref: FIG. 1 and FIG. 2) corresponding to the arc portion 41 of the lower wiring 9. The insulating inclined face curve portion 13 is an example of the bending portion to be described later, which allows the reflected light B' at the metal thin film 7 corresponding thereto reaches the assumedly removed portion 31 in the photoresist 23, as shown in FIG. 15.

As shown in FIG. 1, the two insulating inclined face linear portions 39 are the one side in the width direction portion (inner portion) of the two inclined faces 12 corresponding to the two ridgeline portions 20 (FIG. 3) of the two linear portions 42. The two insulating inclined face linear portions 39 have the same linear shape as that of the ridgeline portion 20 of the two linear portions 42 when viewed from the top.

The insulating inclined face curve portion 13 is one side in the width direction portion (inner portion) of the two inclined faces 12 corresponding to the two ridgeline portions 20 (FIG. 2) of the arc portion 41. The insulating inclined face curve portion 13 has an arc shape that is similar to the arc shape of the arc portion 41 when viewed from the top. The insulating inclined face curve portion 13 is curved gradually toward one side in the width direction as it approaches to the longitudinal other side. The radius R2 of the virtual circle of the insulating inclined face curve portion 13 (to be specific, virtual circle along the widthwise center of the insulating inclined face curve portion 13) is, for example, 5 μm or more, preferably 15 μm or more, and for example, 300 μm or less, preferably 100 μm or less.

1-4. Upper Conductor Pattern

As shown in FIGS. 2 and 3, the upper conductor pattern 5 is a conductor pattern positioned at the upper side, of the lower conductor pattern 3 and the upper conductor pattern 5. The upper conductor pattern 5 is positioned at the top face of the intermediate insulating layer 4. The upper conductor pattern 5 has the first wiring 21 and the second wiring 22 that are next to each other in width direction in spaced-apart relation, and second terminals (not shown) that are continuous with both ends in longitudinal direction of the first wiring 21 and the second wiring 22.

1-4.1. First Wiring

As shown in FIG. 1, the first wiring 21 is a wiring positioned at one side in the width direction in the upper conductor pattern 5. The first wiring 21 is positioned at one side in the width direction of the lower wiring 9 in spaced-apart relation when viewed from the top. The first wiring 21 partially has a generally letter L shape that is the same as that of the lower wiring 9 when viewed from the top. To be specific, the lower wiring 9 integrally includes a first wiring bending portion 37, and two first wiring linear portions 38 continuing to both ends in longitudinal direction of the first wiring bending portion 37.

The first wiring bending portion 37 bents in one side in the width direction toward the longitudinal other side. The first wiring bending portion 37 is spaced apart from one side in the width direction of the arc portion 41 of the lower wiring 9 when viewed from the top. The first wiring bending portion 37 is spaced apart from one side in the width direction of the insulating inclined face curve portion 13 when viewed from the top.

The two first wiring linear portions 38 are disposed so that their extensions cross. The two first wiring linear portions 38 are positioned at one side in the width direction of the two linear portions 42 of the lower wiring 9 in spaced-apart relation. The two linear portions 42 are parallel to the two first wiring linear portions 38 when viewed from the top. The first wiring linear portion 38 positioned at longitudinal one side extends from longitudinal one end portion of the first wiring bending portion 37 to longitudinal one side when viewed from the top. The first wiring linear portion 38 positioned at the longitudinal other side extends from the longitudinal other end portion of the first wiring bending portion 37 to the longitudinal other side when viewed from the top.

The width W2 of the first wiring 21 is not particularly limited, to be specific, for example, 5 μm or more, preferably 8 μm or more, and for example, 200 μm or less, preferably 100 μm or less. The space (space S1 between the first wiring linear portion 38 and the linear portion 42, and space S2 between the first wiring bending portion 37 and the arc portion 41) S between the first wiring 21 and the lower wiring 9 in width direction is, for example, 5 μm or more, preferably 15 μm or more, and for example, 100 μm or less, preferably 50 μm or less.

1-4.2. Second Wiring

The second wiring 22 is a wiring positioned in the upper conductor pattern 5 at the other side in width direction. The second wiring 22 is positioned at the other side in width direction of the first wiring 21 in spaced-apart relation (next to each other) when viewed from the top. The second wiring 22 is independent from the first wiring 21. The second wiring 22 partially has a generally letter L shape when viewed from the top. The second wiring 22 overlaps with the two insulating inclined face linear portions 39, but avoids the insulating inclined face curve portion 13 when viewed from the top. In the following, the second wiring 22 is described in detail.

The second wiring 22 integrally includes an inclined face overlapping avoidance portion 16, and two inclined face overlapping portions 17 at both ends in longitudinal direction of the inclined face overlapping avoidance portion 16.

A. Inclined Face Overlapping Portion

As shown in FIGS. 1 and 3, the two inclined face overlapping portions 17 correspond to the two first wiring linear portions 38. The two inclined face overlapping portions 17 correspond to the two linear portions 42 of the lower wiring 9. The two inclined face overlapping portions 17 are positioned so that it is shifted to one side in the width direction relative to the two linear portions 42 of the lower wiring 9 when viewed from the top. However, the two inclined face overlapping portions 17 overlap with the width-direction-one end edge of the two linear portions 42 when viewed from the top. The two inclined face overlapping portions 17 overlap also with the two insulating inclined face linear portions 39 when viewed from the top.

The other side half in width direction of the two inclined face overlapping portions 17 overlap with one side half in the width direction of the two linear portions 42 when viewed from the top in the entire longitudinal direction. The two inclined face overlapping portions 17 overlap with the two insulating inclined face linear portions 39 in the entire longitudinal direction when viewed from the top.

Meanwhile, one side half in the width direction of the two inclined face overlapping portion 17 is disposed to be side by side in width direction with the two linear portions 42 when viewed from the top.

The two width-direction-one end edges 35A and 35B of the two inclined face overlapping portions 17 are spaced apart at one side in the width direction from the width-direction-one end edge of the two linear portions 42 when viewed from the top. To be specific, the width-direction-one end edges 35A and 35B of the inclined face overlapping portions 17 are positioned, when viewed from the top, between the width-direction-one end edge of the linear portion 42 and the width-direction-the other end edge of the first wiring 21. The two width-direction-one end edges 35A and 35B of the two inclined face overlapping portions 17 are spaced apart at one side in the width direction of the two insulating inclined face linear portions 39 when viewed from the top.

The longitudinal middle portion and one end portion (not shown in FIG. 1) of the width-direction-one end edge 35A positioned at longitudinal one side of the inclined face overlapping portion 17 are in parallel with width-direction-one end edge of the linear portion 42 positioned at longitudinal one side in the lower wiring 9 when viewed from the top. Meanwhile, the longitudinal other end portion of the width-direction-one end edge 35A of the inclined face overlapping portion 17 positioned at longitudinal one side bends gradually so as to be closer to the width-direction-one end edge of the linear portion 42 positioned at longitudinal one side in the lower wiring 9. The above-described longitudinal other end portion of width-direction-one end edge 35A looks like a straight line in FIG. 1, but actually bends with a relatively small curvature C3 (that is, with a relatively large radius of curvature R3 (=1/C3)). That is, the above-described longitudinal other end portion of width-direction-one end edge 35A gradually bends when viewed from the top. The curvature center (not shown in FIG. 1) of the virtual circle of curvature along the longitudinal other end portion of the width-direction-one end edge 35A is positioned at the other side in width direction relative to the width-direction-one end edge 35A. Furthermore, the above-described other end edge in longitudinal direction of the width-direction-one end edge 35A has a one insulating overlapping portion 43 (boundary portion with the arc portion 41) overlapping with the insulating inclined face curve portion 13 when viewed from the top. The radius of curvature R3 is, for example, 5 μm or more, preferably 10 μm or more, and for example, 300 μm or less, preferably 100 μm or less.

The longitudinal middle portion and the other end portion (not shown in FIG. 1) of the width-direction-one end edge 35B of the inclined face overlapping portion 17 positioned at the longitudinal other side are parallel with width-direction-one end edge of the linear portion 42 positioned at the longitudinal other side in the lower wiring 9 when viewed from the top. Meanwhile, the longitudinal one end portion of the width-direction-one end edge 35B of the inclined face overlapping portion 17 positioned at the longitudinal other side bends gradually so as to be closer to the width-direction-one end edge of the linear portion 42 positioned at the longitudinal other side in the lower wiring 9. The above-described longitudinal one end portion of the width-direction-one end edge 35B looks like a straight line in FIG. 1, but actually bends with a small curvature C4 (that is, with a relatively large radius of curvature R4(=1/C4)). That is, the above-described width-direction-one end edge of the width-direction-one end edge 35B gradually bends when viewed from the top. The curvature center (not shown in FIG. 1) of the virtual circle of curvature along the longitudinal one end portion of the width-direction-one end edge 35B is positioned at the other side in width direction relative to width-direction-one end edge 35B. Furthermore, the above-described longitudinal one end edge of the width-direction-one end edge 35B has other insulating overlapping portion 44 (boundary portion with the arc portion 41) overlapping with the insulating inclined face curve portion 13 when viewed from the top. The radius of curvature R4 is the same as the above-described radius of curvature R3.

The two width-direction-other end edges 36A and 36B of the two inclined face overlapping portions 17 are spaced apart relative to width-direction-one end edge of the two linear portions 42 in the other side in width direction when viewed from the top. To be specific, the two width-direction-other end edges 36A and 36B of the two inclined face overlapping portions 17 are positioned between width-direction-one end edge of the two linear portions 42 and the width-direction-other end edge of the two linear portions 42 when viewed from the top. The width-direction-other end edges 36A and 36B of the inclined face overlapping portions 17 are spaced apart at the other side in width direction of the insulating inclined face linear portion 39 when viewed from the top. The two width-direction-other end edges 36A and 36B of the two inclined face overlapping portions 17 have generally the same shape or a generally similar shape with the width-direction-one end edge or the other end edge of the two linear portions 42 when viewed from the top.

Furthermore, the longitudinal other end portion of the inclined face overlapping portion 17 positioned at longitudinal one side has a generally trapezoid shape gradually tapered towards the longitudinal other side when viewed from the top. That is, the width W5 of the longitudinal other end portion of the inclined face overlapping portion 17 positioned at longitudinal one side decreases toward the longitudinal other side. Meanwhile, the longitudinal middle portion of the inclined face overlapping portion 17 positioned at longitudinal one side has a generally rectangular shape having the same width W6 in longitudinal direction when viewed from the top. That is, the width W6 of the longitudinal middle portion of the inclined face overlapping portion 17 positioned at the longitudinal one side is the same along the longitudinal direction.

Longitudinal one end portion of the inclined face overlapping portion 17 positioned at the longitudinal other side has a generally trapezoid shape gradually decreasing its width toward longitudinal one side when viewed from the top. That is, the width W7 of the longitudinal one end portion of the inclined face overlapping portion 17 positioned at the longitudinal other side decreases toward longitudinal one side. Meanwhile, the longitudinal middle portion of the inclined face overlapping portion 17 positioned at the longitudinal other side has a generally rectangular shape having the same width W8 in longitudinal direction when viewed from the top. That is, the width W8 of the longitudinal middle portion of the inclined face overlapping portion 17 positioned at the longitudinal other side is the same along the longitudinal direction.

The space S2 in width direction of the inclined face overlapping portion 17 and the first wiring linear portion 38 is, for example, 5 μm or more, preferably 15 μm or more, and for example, 300 μm or less, preferably 100 μm or less.

The width W6 of the longitudinal middle portion of the inclined face overlapping portion 17 positioned at longitudinal one side and the width W8 of longitudinal middle portion of the inclined face overlapping portion 17 positioned at the longitudinal other side is, for example, the same as the width W2 of the above-described first wiring 21.

The ratio of the width W5 of the longitudinal other end portion of the inclined face overlapping portion 17 positioned at longitudinal one side relative to the width W6 of the longitudinal middle portion (W5/W6) varies in, for example, 0.25 or more, less than 1.00, preferably 0.40 or more, and 0.9 or less.

The ratio of the width W7 of the longitudinal other end portion of the inclined face overlapping portion 17 positioned at the longitudinal other side relative to the width W8 of the longitudinal middle portion (W7/W8) varies in, for example, 0.25 or more, less than 1.00, preferably 0.40 or more, and 0.9 or less.

B. Inclined Face Overlapping Avoidance Portion

As shown in FIGS. 1 and 2, the inclined face overlapping avoidance portion 16 is in correspondence with the first wiring bending portion 37. The inclined face overlapping avoidance portion 16 is in correspondence with the arc portion 41 of the lower wiring 9. The inclined face overlapping avoidance portion 16 is positioned between the two inclined face overlapping portions 17 in longitudinal direction. To be specific, the inclined face overlapping avoidance portion 16 is continuous with the longitudinal other end edge of the inclined face overlapping portion 17 positioned at longitudinal one side, and longitudinal one end edge of the inclined face overlapping portion 17 positioned at the longitudinal other side, and connects them in longitudinal direction.

The inclined face overlapping avoidance portion 16 avoids the insulating inclined face curve portion 13 when viewed from the top. To be specific, the inclined face overlapping avoidance portion 16 avoids the insulating inclined face curve portion 13 between one insulating overlapping portion 43 and the other insulating overlapping portion 44 in longitudinal direction. That is, the inclined face overlapping avoidance portion 16 does not overlap with the insulating inclined face curve portion 13 between one insulating overlapping portion 43 and the other insulating overlapping portion 44 by shifting to the other side in width direction relative to the insulating inclined face curve portion 13 when viewed from the top. The inclined face overlapping avoidance portion 16 is independent from the insulating inclined face curve portion 13 when viewed from the top. The inclined face overlapping avoidance portion 16 is spaced apart to the other side in width direction relative to the insulating inclined face curve portion 13 when viewed from the top. The inclined face overlapping avoidance portion 16 overlaps with (portion slightly one side in the width direction of) the widthwise middle portion of the arc portion 41 when viewed from the top.

The width-direction-other end edge 36C of the inclined face overlapping avoidance portion 16 has a curved shape when viewed from the top. To be specific, the width-direction-other end edge 36C of the inclined face overlapping avoidance portion 16 has the same curved shape as that of the arc portion 41 of the lower wiring 9 when viewed from the top.

The width-direction-one end edge 35C of the inclined face overlapping avoidance portion 16 has a curved shape when viewed from the top. To be specific, the width-direction-one end edge 35C of the inclined face overlapping avoidance portion 16 has a curved shape having a smaller radius of curvature R3 than the radius of curvature R1 of the arc portion 41 of the lower wiring 9 and the radius of curvature R2 of the virtual circle along the insulating inclined face curve portion 13.

The inclined face overlapping avoidance portion 16 has, continuously, a longitudinal one side portion 47 and a longitudinal other side portion 48 that is positioned at the longitudinal other side.

The longitudinal one side portion 47 gradually goes away from the width-direction-one end edge (and insulating inclined face curve portion 13) of the arc portion 41, as it approaches the longitudinal other side when viewed from the top. Meanwhile, the longitudinal other side portion 48 gradually goes away from the width-direction-one end edge (and insulating inclined face curve portion 13) of the arc portion 41 as it approaches longitudinal one side when viewed from the top. Therefore, the boundary portion of the longitudinal one side portion 47 and the longitudinal other side portion 48, to be specific, the longitudinal center portion of inclined face overlapping avoidance portion 16 of the width-direction-one end edge 35C is the most distant relative to the width-direction-one end edge of the arc portion 41.

For example, the longitudinal one side portion 47 and the longitudinal other side portion 48 of the inclined face overlapping avoidance portion 16 have smaller radius of curvature R5 and R6 relative to the radius of curvature R3 and R4 of the width-direction-one end edge 35A and 35B of the inclined face overlapping portion 17, respectively. The ratio of the radius of curvature R5 relative to the radius of curvature R3 (R5/R3) is, for example, less than 1, preferably 0.9 or less, and for example, 0.2 or more, preferably 0.5 or more. The ratio of the radius of curvature R6 relative to the radius of curvature R4 (R6/R4) is, for example, less than 1, preferably 0.9 or less, and for example, 0.2 or more, preferably 0.5 or more.

The curvature center (curvature center of virtual circle forming radius of curvature R5 and radius of curvature R6) of the virtual circle along the width-direction-one end edge 35C of the inclined face overlapping avoidance portion 16 is positioned at one side in the width direction relative to the width-direction-one end edge 35C.

Meanwhile, in the second wiring 22, the widths of the longitudinal other end portion of the inclined face overlapping portion 17 positioned at longitudinal one side, the inclined face overlapping avoidance portion 16 (longitudinal one side portion 47 and longitudinal other side portion 48), and the longitudinal one end portion of the inclined face overlapping portion 17 positioned at the longitudinal other side gradually decrease from both sides in longitudinal direction towards the longitudinal center portion of the inclined face overlapping avoidance portion 16 so that the width is the smallest at the longitudinal center portion of the inclined face overlapping avoidance portion 16. The smallest width W4 in the inclined face overlapping avoidance portion 16 relative to the width W6 and width W8 as 100% is, for example, 80% or less, preferably 60% or less, and for example, 20% or more, preferably 40% or more. To be specific, the width W4 is, for example, 3 µm or more, preferably 6 µm or more, and for example, 150 µm or less, preferably 100 µm or less.

In the second wiring 22, the two inclined face overlapping portions 17 overlaps with the insulating inclined face linear portion 39 when viewed from the top, while the inclined face overlapping avoidance portion 16 does not overlap with the insulating inclined face curve portion 13 and avoiding when viewed from the top.

The maximum space S3 between the inclined face overlapping avoidance portion 16 and the first wiring bending portion 37 in the width direction (maximum space between the longitudinal center portion of the width-direction-one end edge 35C of the inclined face overlapping avoidance portion 16 and the width-direction-other end edge of the first wiring bending portion 37) is, for example, 8 µm or more, preferably 15 µm or more, and for example, 300 µm or less, preferably 100 µm or less. The ratio of the space S3 relative to the space S2 (space S3/space S2) is, for example, more than 1.1, preferably 1.2 or more, more preferably 1.4 or more, and for example, 2 or less. The space S5 between the longitudinal center portion of the width-direction-one end edge 35C of the inclined face overlapping avoidance portion 16 and the longitudinal center portion of the width-direction-one end edge of the arc portion 41 is, for example, 2 µm or more, preferably 5 µm or more, and for example, 200 µm or less, preferably 100 µm or less. The ratio of the space S5 between the inclined face overlapping avoidance portion 16 and the arc portion 41 relative to the width W1 of the lower wiring 9 (space S5/width W1) is, for example, 0.1 or more, preferably 0.2 or more, and for example, 1 or less, preferably 0.5 or less.

The upper conductor pattern 5 has a thickness of, for example, 1 µm or more, preferably 3 µm or more, and for example, 20 µm or less, preferably 12 µm or less.

1-5. Insulating Cover Layer

As shown in FIGS. 2 and 3, the insulating cover layer 6 is the uppermost layer of the wired circuit board 1. The insulating cover layer 6 is disposed at the top face of the intermediate insulating layer 4 so as to cover the side face and the top face of the upper conductor pattern 5. Although not shown, the insulating cover layer 6 allows the second terminal (not shown) of the upper conductor pattern 5 to expose. The insulating cover layer 6 is composed of the insulating material given as examples for the insulating base layer 2. The insulating cover layer 6 has a thickness of, for example, 1 µm or more, preferably 3 µm or more, and for example, 40 µm or less, preferably 10 µm or less.

2. Method for Producing a Wired Circuit Board

The production method of the wired circuit board 1 includes a step i (ref: FIG. 4A), in which an insulating base layer 2 is prepared, a step ii (ref: FIG. 4B), in which a lower conductor pattern 3 is provided on the top face of the insulating base layer 2, a step 1, in which an intermediate insulating layer 4 is provided on the top face of the insulating base layer 2 so as to cover the lower conductor pattern 3 (ref: FIG. 4C), and a step 2, in which (ref: FIG. 4D) a metal thin film 7 is provided on the top face of the intermediate insulating layer 4.

The production method of the wired circuit board 1 further includes a step 3, in which (ref: FIG. 5E) a photoresist 23 is provided on the top face of the metal thin film 7, a step 4, in which (ref: FIG. 5F) the photoresist 23 is exposed to light through a photomask 28, and a step 5, in which (ref: FIG. 5G) in the photoresist 23, a first exposure portion 24 corresponding to the first wiring 21 and a second exposure portion 25 corresponding to the second wiring 22 are removed to expose the metal thin film 7 corresponding to the first exposure portion 24 and the second exposure portion 25.

Figure 6H:
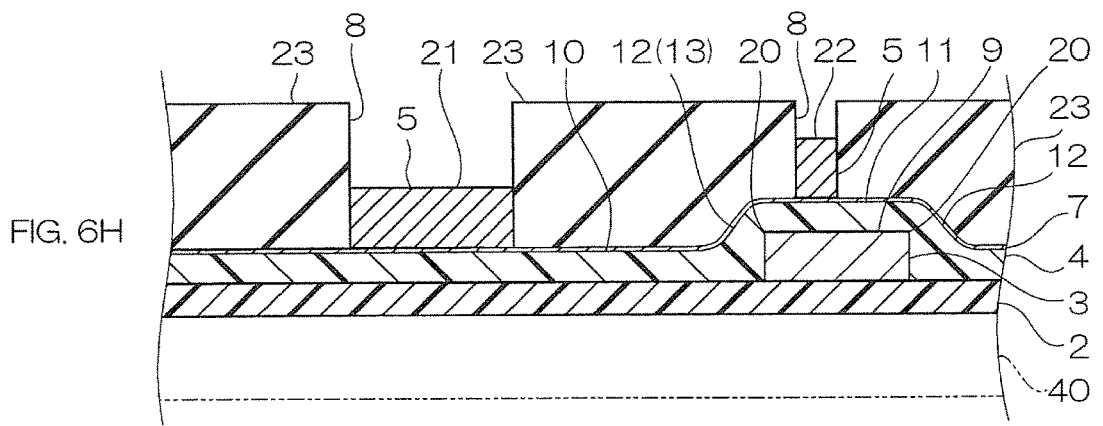
FIG. 6H to FIG. 6K show, following FIG. 5G, a portion of the process diagram for the method for producing a wired circuit board shown in FIG. 2, FIG. 6H illustrating a step 6, in which an upper conductor pattern is provided, FIG. 6I illustrating a step iii, in which a photoresist is removed, FIG. 6J illustrating a step v, in which the metal thin film corresponding to the photoresist is removed, and FIG. 6K illustrating a step v, in which an insulating cover layer is provided.
Figure 6I:
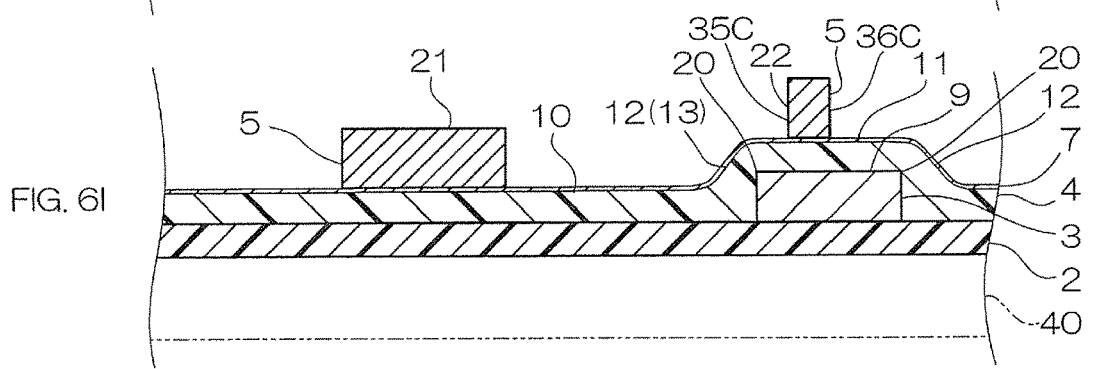
Figure 6J:
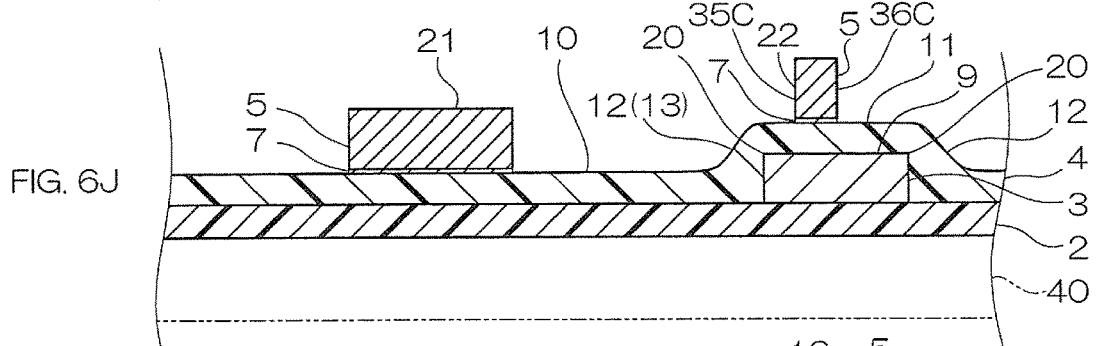
Figure 6K:
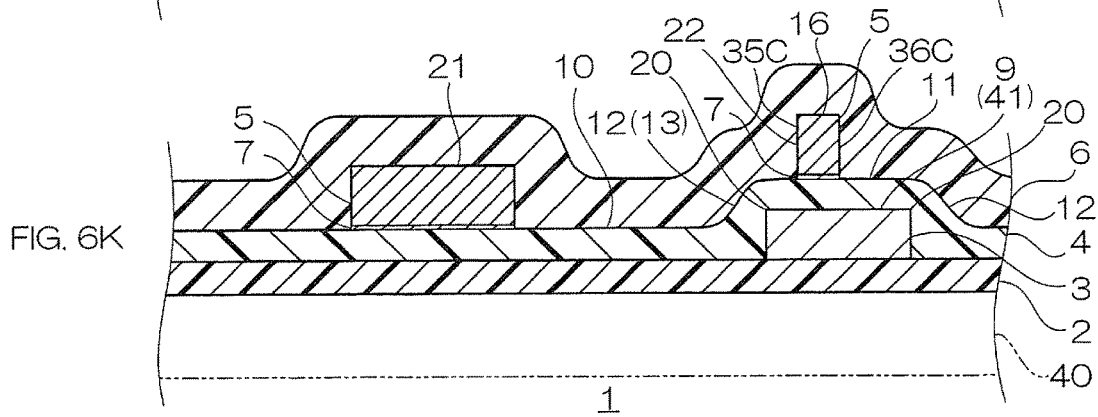

The production method of the wired circuit board 1 further includes a step 6, in which (ref: FIG. 6H) an upper conductor pattern 5 is provided on the metal thin film 7 exposed from the photoresist 23; a step iii (ref: FIG. 6I), in which the photoresist 23 is removed; a step iv (ref: FIG. 6J), in which the metal thin film 7 corresponding to the photoresist 23 is removed; and a step v (ref: FIG. 6K), in which an insulating cover layer 6 is provided on the top face of the intermediate insulating layer 4 so as to cover the upper conductor pattern 5.

In the production method of the wired circuit board 1, the step i to step ii, the step 1 to step 6, and the step iii to step v are sequentially conducted. Each step is described in the following.

2-1. Step i

As shown in FIG. 4A, in the step i, the insulating base layer 2 is prepared.

2-2. Step ii

As shown in FIG. 4B, in the step ii, the lower conductor pattern 3 is provided on the top face of the insulating base layer 2, by, for example, an additive method, or a subtractive method.

2-3. Step 1

As shown in FIG. 4C, in the step 1, the intermediate insulating layer 4 is provided on the top face of the insulating base layer 2 so as to cover the lower conductor pattern 3.

To provide the intermediate insulating layer 4 on the insulating base layer 2, for example, varnish of a photosensitive insulating material is applied on the top face of the insulating base layer 2, exposed to light and developed, and thereafter, as necessary, heated. Alternatively, the intermediate insulating layer 4 formed in advance into a pattern exposing the first terminal, which is not shown, is allowed to adhere onto the insulating base layer 2 through an adhesive, which is not shown.

At this time, the inclined face 12 and the second flat face 11 are formed on the top face of the intermediate insulating layer 4 corresponding to the lower conductor pattern 3. A first flat face 10 is formed on the top face of the intermediate insulating layer 4 which is distant from the lower conductor pattern 3.

In this manner, the intermediate insulating layer 4 having the first flat face 10, the second flat face 11, and the inclined face 12 as the top face is provided.

2-4. Step 2

As shown in FIG. 4D, in the step 2, the metal thin film 7 is provided on the top face of the intermediate insulating layer 4.

The metal thin film 7 can serve as a seed film (feeding layer) in the additive method of the step 6 (described later, ref: FIG. 6H). The metal thin film 7 is a layer that can be integrated with the upper conductor pattern 5 when the upper conductor pattern 5 is obtained in the additive method (ref: FIG. 2 and FIG. 3).

The metal thin film 7 is provided, for example, on the entire surface of the intermediate insulating layer 4 (surface including the first flat face 10, inclined face 12, and second flat face 11).

The metal thin film 7 is made of a metal material. Examples of the metal material include copper, chromium, nickel, and an alloy thereof, and preferably, copper and chromium are used. The metal thin film 7 can be made of a single or a plurality of layers (not shown in FIG. 4D). Preferably, the metal thin film 7 consists of the two layers of a first thin film (to be specific, chromium thin film), and a second thin film (copper thin film) provided thereon.

The metal thin film 7 is in conformity with the top face of the intermediate insulating layer 4.

Therefore, in the metal thin film 7, the top face of the portion corresponding to the first flat face 10 and the second flat face 11 of the intermediate insulating layer 4 is in parallel with the first flat face 10 and the second flat face 11, that is, is along the surface direction.

Meanwhile, in the metal thin film 7, the top face of the portion corresponding to the inclined face 12 is in parallel with the inclined face 12 of the intermediate insulating layer 4, that is, inclined relative to the surface direction.

The metal thin film 7 has a thickness of, for example, 10 nm or more, preferably 30 nm or more, and for example, 300 nm or less, preferably 200 nm or less. When the metal thin film 7 consists of the two layers of the first thin film and the second thin film, the first thin film has a thickness of, for example, 10 nm or more, 100 nm or less, and the second thin film has a thickness of, for example, 50 nm or more, 200 nm or less.

To provide the metal thin film 7 on the top face of the intermediate insulating layer 4, for example, a sputtering method and a plating method are used, and preferably, a sputtering method is used.

The metal thin film 7 has a surface reflectivity for light having a wavelength of 400 nm at an angle of incidence of 45 degrees of, for example, 15% or more, preferably 20% or more, more preferably 30% or more, and for example, 60% or less. The surface reflectivity is calculated in conformity with the method described in, for example, JIS Z 8741 (1997). When the metal thin film 7 has a surface reflectivity of below the above-described lower limit, the incident light B' to be described later is not generated, and the problem in the of the present invention may be absent.

2-5. Step 3

As shown in FIG. 5E, in the step 3, the photoresist 23 is provided on the top face of the metal thin film 7.

The photoresist 23 is a positive type photoresist (positive photoresist). The positive type photoresist is a resist that allows the portion to which light (a predetermined amount or more of light) is applied at the time of exposure to be removed in developing thereafter, and meanwhile, the portion which is shielded from light at the time of exposure (the portion to which light is not applied, to be specific, the portion to which less than the predetermined amount of light is applied) to remain in developing thereafter. The photoresist 23 includes, for example, a dry film resist (DFR). The photoresist 23 can serve as a plating resist, as shown in FIG. 6H, in plating in the step 6.

The photoresist 23 allows light in the step 4 (ref: FIG. 5F) (e.g., ultraviolet ray, etc.) to partially pass through. To be specific, the photoresist 23 has a ultraviolet ray transmission of, for example, 10% or more, preferably 20% or more, and for example, 60% or less, preferably 50% or less.

The above-described photoresist 23 is disposed on the entire top face of the metal thin film 7.

At that time, the dry film photoresist is pressed (pushed onto) using, for example, a flat plate. Therefore, the top face of the photoresist 23 is a flat face.

The photoresist 23 has a thickness of, for example, 10 μm or more, and for example, 50 μm or less, preferably 30 μm or less.

2-6. Step 4

As shown in FIG. 5F, in the step 4, first, the photomask 28 is disposed, and then, the photoresist 23 is exposed to light through the photomask 28.

The photomask 28 includes a light-shield-portion 29 and a light transmissive portion 30.

The light-shield-portion 29 blocks light from the light source (not shown) positioned above the photomask 28. In this manner, the photoresist 23 corresponding to the light-shield-portion 29 is shielded from light. As shown in FIG. 5F and FIG. 5G, the light-shield-portion 29 has a pattern that is the same as the photoresist 23 after the step 5 when viewed from the top. Furthermore, the light-shield-portion 29 has a reverse pattern to the first wiring 21 and the second wiring 22 provided in the step 6, as shown in FIG. 5F and FIG. 6H, when viewed from the top.

The light transmissive portion 30 is configured to allow the light applied from the light source to pass trough and reach the photoresist 23. As shown in FIG. 5F and FIG. 5G, the light transmissive portion 30 has a pattern that is the same as the pattern of the opening 8 of the photoresist 23 after the step 5. Furthermore, as shown in FIG. 5F and FIG. 6H, the light transmissive portion 30 has a pattern that is the same as the first wiring 21 and the second wiring 22 provided in the step 6 when viewed from the top. The light transmissive portion 30 independently has a first light transmissive portion 51 having the same pattern as that of the first wiring 21 and a second light transmissive portion 52 having the same pattern as that of the second wiring 22 when viewed from the top.

The above-described photomask 28 having the light-shield-portion 29 and the light transmissive portion 30 is disposed above the photoresist 23. The photomask 28 is positioned so that the light passing through the light transmissive portion 30 produces the first exposure portion 24 and the second exposure portion 25 in the photoresist 23.

The first exposure portion 24 and the second exposure portion 25 correspond to the first wiring 21 and the second wiring 22 respectively, as shown in FIG. 5F and FIG. 6H. That is, the first exposure portion 24 and the second exposure portion 25 have the same pattern as that of the first wiring 21 and the second wiring 22, respectively, when viewed from the top.

Thereafter, in the step 4, as shown in the arrow in FIG. 5F, the photoresist 23 is exposed to light through the photomask 28.

To expose the photoresist 23 to light, light is applied from the light source disposed above the photomask 28 to the photomask 28. The light has a wavelength of, for example, 100 nm or more, preferably 350 nm or more, and for example, 800 nm or less, preferably 450 nm or less. The application (exposure) amount is, for example, 100mJ/cm$^2$ or more, and 800mJ/cm$^2$ or less.

The light A passed through the first light transmissive portion 51 produces the first exposure portion 24 in the photoresist 23.

The first exposure portion 24 has the same shape as that of the first wiring 21 (ref: FIG. 1 and FIG. 6H) to be provided later when viewed from the top.

Meanwhile, the light B passed through the second light transmissive portion 52 produces the second exposure portion 25 in the photoresist 23.

The second exposure portion 25 has the same shape as that of the second wiring 22 (ref: FIG. 1 and FIG. 6H) to be provided later when viewed from the top. As shown in FIG. 1, the second exposure portion 25 has an avoidance portion 26 having the same shape as that of the inclined face overlapping avoidance portion 16 when viewed from the top, and an overlapping portion 27 (ref: FIG. 1) having the same shape as that of the inclined face overlapping portion 17 when viewed from the top. The avoidance portion 26 avoids the insulating inclined face curve portion 13 of the inclined face 12 when viewed from the top. That is, the avoidance portion 26 and the insulating inclined face curve portion 13 are independent from each other when viewed from the top.

Meanwhile, the light B applied to the light-shield-portion 29 between the first light transmissive portion 51 and the second light transmissive portion 52 is blocked by the light-shield-portion 29 and does not reach the photoresist 23. Therefore, the light B does not reach the metal thin film 7 positioned below the above-described photoresist 23 and facing the insulating inclined face curve portion 13.

Therefore, the reflected light B' (described in detail in "3." later on. ref: FIG. 15 and FIG. 16A) to be described later is not produced.

2-7. Step 5

As shown in FIG. 5G, in the step 5, the first exposure portion 24 and the second exposure portion 25 of the photoresist 23 are removed.

To be specific, first, as necessary, the photoresist 23 after exposure is heated (heating after exposure).

Then, the photoresist 23 is developed with a developer. In this manner, the portion other than the first exposure portion 24 and the second exposure portion 25 in the photoresist 23 is left, and only the first exposure portion 24 and the second exposure portion 25 are removed. That is, in the photoresist 23, the openings 8 corresponding to the first exposure portion 24 and the second exposure portion 25 are formed. The openings 8 penetrate the photoresist 23 in the thickness direction.

In this manner, the metal thin film 7 corresponding to the first exposure portion 24 and the second exposure portion 25 is exposed from the opening 8.

Thereafter, as necessary, the photoresist 23 is cured by heating.

2-8. Step 6

As shown in FIG. 6H, in the step 6, first, the upper conductor pattern 5 is provided on the top face of the metal thin film 7 exposed from the opening 8 of the photoresist 23.

To provide the upper conductor pattern 5 on the top face of the metal thin film 7, electrolytic plating in which electricity is supplied from the metal thin film 7 is used.

At this time, the photoresist 23 is used as a plating resist. The metal thin film 7 is used as a feeding layer.

In this manner, the upper conductor pattern 5 is formed into a pattern having the first wiring 21 and the second wiring 22 independently next to each other.

2-9. Step iii

As shown in FIG. 6I, in the step iii, the photoresist 23 is removed.

To be specific, the photoresist 23 is removed by, for example, wet etching.

2-10. Step iv

As shown in FIG. 6J, in the step iv, the metal thin film 7 corresponding to the photoresist 23 (FIG. 6H) is removed.

To be specific, the metal thin film 7 positioned below the photoresist 23 is removed by, for example, peeling.

2-11. Step v

As shown in FIG. 6K, in the step v, the insulating cover layer 6 is provided in a pattern such that the first wiring 21 and the second wiring 22 of the upper conductor pattern 5 are covered, and the second terminal (not shown) is exposed. The insulating cover layer 6 is provided in the same manner as the intermediate insulating layer 4.

In this manner, the wired circuit board 1 including the insulating base layer 2, the lower conductor pattern 3, the intermediate insulating layer 4, the metal thin film 7, the upper conductor pattern 5, and the insulating cover layer 6 is produced.

In the wired circuit board 1, the metal thin film 7 is integrated with the upper conductor pattern 5. To be specific, the metal thin film 7 can be incorporated as a portion of the upper conductor pattern 5. In such a case, as shown in FIGS. 2 and 3, the metal thin film 7 may not be clearly distinguished from the upper conductor pattern 5.

Use of such a wired circuit board 1 is not particularly limited, and for example, it is used as various wired circuit boards: a suspension board with circuit included in a hard disk drive and including the metal supporting board 40 (ref: phantom line in FIG. 2 and FIG. 3, the metal supporting board 40 disposed at the lower face of the insulating base layer 2), and a flexible wired circuit board not including the metal supporting board and having flexibility. In particular, the wired circuit board 1 is suitably used in a suspension board with circuit that requires a high density wire (conductor pattern), and is a suspension board with circuit having the arc portion 41, the first wiring bending portion 37, and the inclined face overlapping avoidance portion 16 in the head mounting region.

3.

A. Light Focus (Assumption)

The following assumption is considered: a wired circuit board 1 in which the second wiring 22 has no inclined face overlapping avoidance portion 16 (ref: FIG. 1), as shown in FIG. 15, is produced. In this assumption, the second wiring 22 overlaps with both of the insulating inclined face curve portion 13 and the insulating inclined face linear portion 39 along the entire longitudinal direction. In this assumption as well, the step 4 shown in FIG. 16A, step 5 shown in FIG. 16B, and step 6 shown in FIG. 16C are sequentially conducted.

As shown in FIG. 15 and FIG. 16A, in the step 4, the first light transmissive portion 51 and the second light transmissive portion 52 of the photomask 28 has the same pattern as that of the first wiring 21 and the second wiring 22 (ref FIG. 17) when viewed from the top. That is, in the photomask 28, the first light transmissive portion 51 and the second light transmissive portion 52 are disposed independently. The second wiring 22 has generally the same or similar shape with that of the first wiring 21. The second wiring 22 is disposed on the other side in width direction of the first wiring 21 in spaced apart relation, and when viewed from the top, has a pattern such that the first wiring linear portion 38 can be overlapped with the insulating inclined face linear portion 39. The second wiring 22 does not include the inclined face overlapping avoidance portion 16, but consists only of the inclined face overlapping portion 17. The inclined face overlapping portion 17 includes, when viewed from the top, an insulating inclined face curve portion 13.

As shown in FIG. 16A, in the step 4, the photoresist 23 is exposed to light through the photomask 28. In particular, the light B passed through the second light transmissive portion 52 reaches the photoresist 23, goes through the photoresist 23, and then a portion of the light produces reflected light B' at the metal thin film 7 corresponding to the insulating inclined face curve portion 13. The reflected light B' passes through the photoresist 23 widthwise one side and obliquely upward when viewed in cross section, and reaches the assumedly removed portion 31 of the photoresist 23.

Furthermore, as shown in the arrow in FIG. 15, the reflected light B' produced at the metal thin film 7 corresponding to the insulating inclined face curve portion 13 focuses on the center (center of the arc portion 41) C of the virtual circle along the insulating inclined face curve portion 13 when viewed from the top. That is, when viewed from the top, the metal thin film 7 corresponding to the insulating inclined face curve portion 13 works like a concave lens, and the reflected light B' is focused on the point of the center C. Therefore, the amount of light at the assumedly removed portion 31 including the center C and its vicinity is relatively high. To be specific, the amount of light at the assumedly removed portion 31 is the amount of light that allows the assumedly removed portion 31 to be removed in the step 5 or even more. The boundary light amount is a boundary value that causes the assumedly removed portion 31 to remain when the amount of light is below the boundary value, and the assumedly removed portion 31 to be removed when the amount of light is the boundary value or more.

Then, in the step 5, as shown in the phantom line of FIG. 16B, although the assumedly removed portion 31 is to be remained, as shown in the solid line of FIG. 16B, the assumedly removed portion 31 does not remain, that is, the assumedly removed portion 31 is removed (disappears).

Meanwhile, in the step 4, sufficient amount of light reaches the first exposure portion 24 corresponding to the first light transmissive portion 51 and the second exposure portion 25 corresponding to the second light transmissive portion 52 after passing through the first light transmissive portion 51 and the second light transmissive portion 52, respectively, and therefore, in the step 5, the first exposure portion 24 and the second exposure portion 25 are removed.

That is, in the step 5, removal of the assumedly removed portion 31 causes the opening 8 corresponding to the first exposure portion 24 to communicate with the opening 8 corresponding to the second exposure portion 25.

Figure 17:
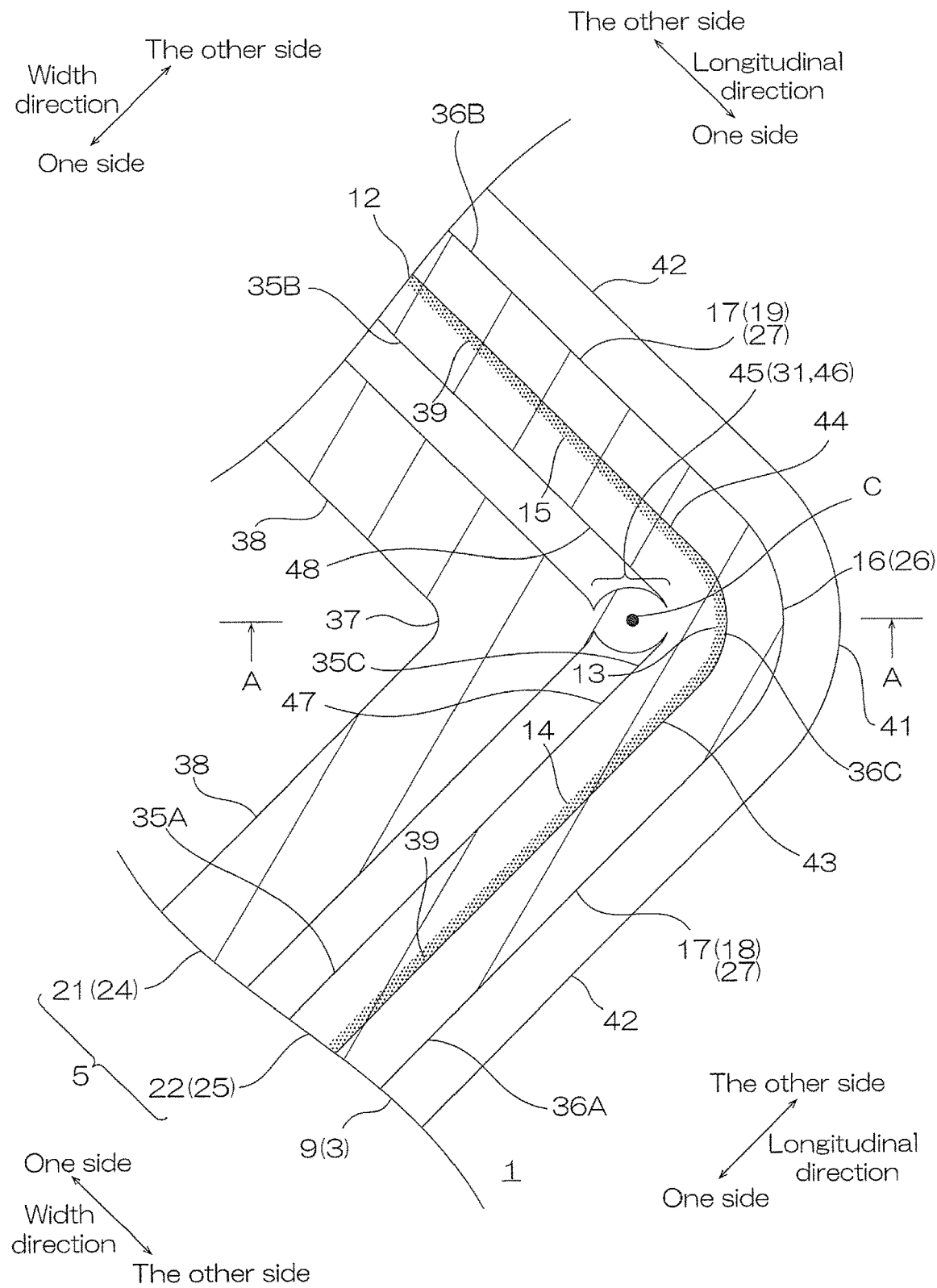
FIG. 17 shows an enlarged plan view of the wired circuit board produced through the steps of FIG. 16A to FIG. 16C, or FIG. 18A to FIG. 18C.

Then, in the step 6, when the upper conductor pattern 5 is provided on the top face of the metal thin film 7 exposed from the photoresist 23, as shown in FIG. 16C and FIG. 17, in addition to the first wiring 21 and the second wiring 22, a short circuit portion 45 corresponding to the assumedly removed portion 31 and connecting the first wiring 21 and the second wiring 22 is unintendedly provided. The short circuit portion 45 has the same pattern as that of the assumedly removed portion 31. The short circuit portion 45 connects the first wiring 21 and the second wiring 22 when viewed from the top. The short circuit portion 45 has a generally circular shape when viewed from the top with the above-described center C as the center.

That is, the upper conductor pattern 5 is a defective pattern having the short circuit portion 45.

B. First Embodiment with No Light Focus

However, in the production method of the first embodiment, as shown in FIG. 1 and FIG. 5F, the second exposure portion 25 has the avoidance portion 26 that avoids the insulating inclined face curve portion 13 when viewed from the top. Then, in the step 4, the photoresist 23 is exposed to light through the photomask 28 so that the photoresist 23 corresponding to the insulating inclined face curve portion 13 is shielded from light, and therefore the reflected light reflected at B' (ref: FIG. 15 and FIG. 16A) is not produced at the metal thin film 7 corresponding to the insulating inclined face curve portion 13. Therefore, in the step 5, production of the assumedly removed portion 31 caused by the above-described light focus can be prevented. As a result, in the step 6, the short circuit of the first wiring 21 and the second wiring 22 can be prevented. That is, the defective pattern in the upper conductor pattern 5 can be prevented.

With the production method of the first embodiment, as long as the second exposure portion 25 includes the avoidance portion 26 and the overlapping portion 27, the second wiring 22 can be provided highly freely.

Modified Example of First Embodiment

In the first embodiment, as shown in FIG. 1, two inclined face overlapping portions 17 overlap with the two insulating inclined face linear portions 39 along the entire longitudinal direction when viewed from the top.

However, the two inclined face overlapping portions 17 overlapping with the two insulating inclined face linear portions 39 partially in longitudinal direction when viewed from the top will suffice. For example, although not shown, the inclined face overlapping portion 17 positioned at longitudinal one side can have a shape in which its longitudinal other end portion overlaps with the insulating inclined face linear portion 39 and its middle portion and longitudinal one end portion do not overlap with the insulating inclined face linear portion 39. The inclined face overlapping portion 17 positioned at the longitudinal other side can have a shape in which its longitudinal one end portion overlaps with the insulating inclined face linear portion 39 and its middle portion and the other end portion longitudinal direction do not overlap with the insulating inclined face linear portion 39.

In the first embodiment, the inclined face overlapping avoidance portion 16 is shifted toward the other side in width direction relative to the width-direction-one end edge of the arc portion 41. That is, as shown in FIG. 1, space S5 between the inclined face overlapping avoidance portion 16 and the arc portion 41 is present.

However, the inclined face overlapping avoidance portion 16 avoiding the insulating inclined face curve portion 13 will suffice, and to be specific, the inclined face overlapping avoidance portion 16 positioned at one side in the width direction of the insulating inclined face curve portion 13 will suffice. For example, when viewed from the top, it can be overlapped with the width-direction-one end edge of the arc portion 41 (that is, the above-described space 85 is zero. that is, the above-described space S5 is absent.).

Second Embodiment

In the second embodiment, for the members and the production step that are the same as the first embodiment, the same reference numerals are given and detailed descriptions thereof are omitted.

In the first embodiment, as shown in FIG. 1, the inclined face overlapping avoidance portion 16 of the second wiring 22 avoids toward the other side in width direction relative to the insulating inclined face curve portion 13.

Figure 7:
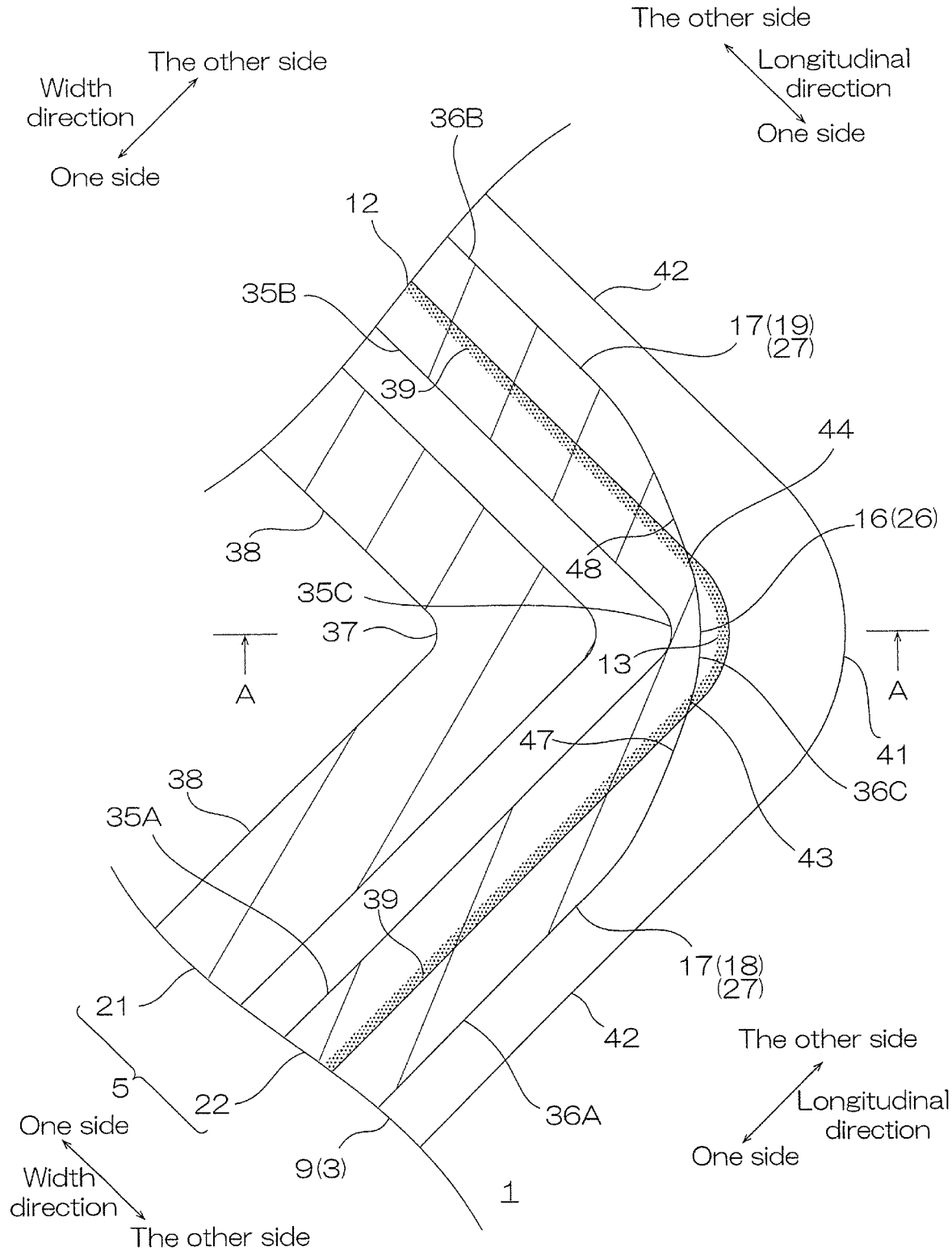
FIG. 7 shows an enlarged plan view of the arc portion and the inclined face overlapping avoidance portion of the wired circuit board produced in the second embodiment (embodiment in which two linear portions are provided per one arc portion in the lower wiring, and the inclined face overlapping avoidance portion is positioned at the other side in width direction of the insulating inclined face curve portion) of the method for producing a wired circuit board of the present invention.

Meanwhile, in the second embodiment, as shown in FIG. 7, the inclined face overlapping avoidance portion 16 avoids toward one side in the width direction relative to the insulating inclined face curve portion 13.

The inclined face overlapping avoidance portion 16 is positioned at one side in the width direction of the insulating inclined face curve portion 13 in spaced-apart relation. The inclined face overlapping avoidance portion 16 is positioned at one side in the width direction of the are portion 41 in spaced-apart relation.

The width-direction-one end edge 35C of the inclined face overlapping avoidance portion 16 is positioned between the width-direction-other end edge of the first wiring 21 and the width-direction-one end edge of the lower wiring 9 when viewed from the top. The width-direction-one end edge 35C of the inclined face overlapping avoidance portion 16 has the same or similar shape as that of the width-direction-one end edge or the other end edge of the first wiring 21 when viewed from the top.

The width-direction-other end edge 36C of the inclined face overlapping avoidance portion 16 connects one insulating overlapping portion 43 and the other insulating overlapping portion 44. One insulating overlapping portion 43 and the other insulating overlapping portion 44 corresponds to the other end edge longitudinal direction of the inclined face overlapping portion 17 positioned at longitudinal one side, and longitudinal one end edge of the inclined face overlapping portion 17 positioned at the longitudinal other side, respectively, in the inclined face 12 of one side in the width direction. The width-direction-other end edge 36C of the inclined face overlapping avoidance portion 16 has a shape which is spaced apart gradually from the inclined face overlapping avoidance portion 16 from one insulating overlapping portion 43 and the other insulating overlapping portion 44 toward the longitudinal center portion when viewed from the top. The width-direction-other end edge 36C of the inclined face overlapping avoidance portion 16 has a moderate curved shape when viewed from the top compared with the width-direction-one end edge 35C of the inclined face overlapping avoidance portion 16.

As shown in FIG. 8A, in the step 4 of the second embodiment, the light B applied to the light-shield-portion 29 positioned at the other side in width direction of the second light transmissive portion 52 is blocked by the light-shield-portion 29, and does not reach the photoresist 23. Therefore, light B does not reach the metal thin film 7 positioned below the above-described photoresist 23 and facing the insulating inclined face curve portion 13.

Therefore, the above-described reflected light B' is not produced. As a result, the assumedly remained portion 46 (ref: FIG. 17) is not produced in the photoresist 23.

Other production steps in the second embodiment are in accordance with the production method in the first embodiment.

With the second embodiment, operations and effects that are the same as the first embodiment can be achieved.

Third Embodiment

In the third embodiment, for those members and production steps that are the same as the first and the second embodiments, the same reference numerals are given and detailed descriptions thereof are omitted.

In the first embodiment, as shown in FIG. 1, two inclined face overlapping portions 17 are provided per one inclined face overlapping avoidance portion 16.

Figure 9:
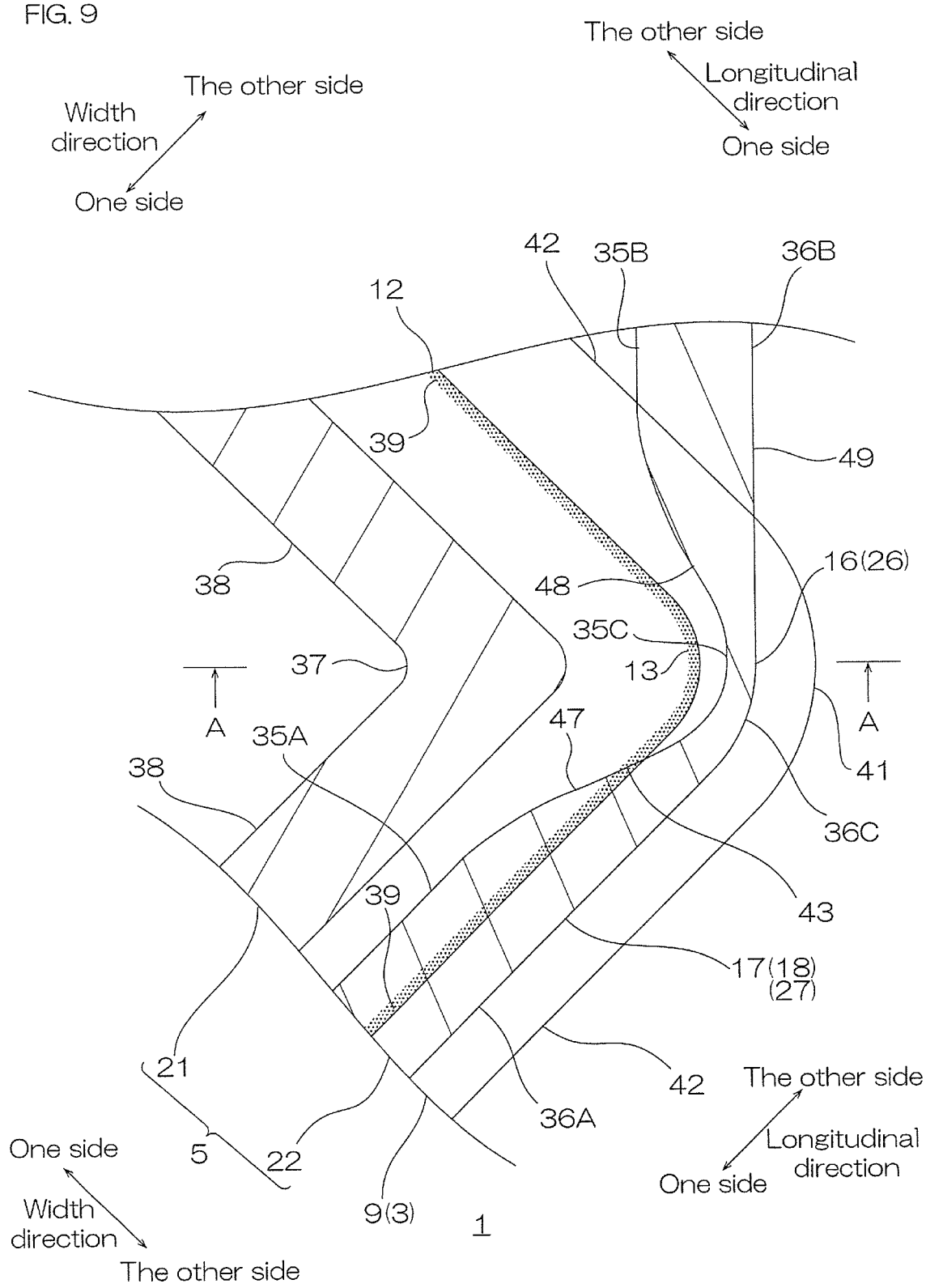
FIG. 9 shows an enlarged plan view of the arc portion and the inclined face overlapping avoidance portion of the wired circuit board produced in the third embodiment (embodiment in which one linear portion is provided per one arc portion in the lower wiring) of the method for producing a wired circuit board of the present invention.

Meanwhile, in the third embodiment, as shown in FIG. 9, one inclined face overlapping portion 17 is provided per one inclined face overlapping avoidance portion 16.

One inclined face overlapping portion 17 is positioned at longitudinal one side of the inclined face overlapping avoidance portion 16.

Meanwhile, the second wiring 22 has the other side portion 49 positioned at the longitudinal other side of the inclined face overlapping avoidance portion 16. The other side portion 49 extends from the other end edge of the longitudinal direction of the inclined face overlapping avoidance portion 16 to be spaced apart from the linear portion 42 positioned at the longitudinal other side. To be specific, longitudinal one end portion of the other side portion 49 partially overlaps with the lower wiring 9 when viewed from the top. Meanwhile, the longitudinal middle portion and the longitudinal other end portion of the other side portion 49 do not overlap with the lower wiring 9.

The production method of the third embodiment is in accordance with the production method of the first embodiment.

With the third embodiment as well, the same operations and effects as those of the first embodiment can be achieved.

Fourth Embodiment

In the fourth embodiment, for those members and production steps that are the same as the first to third embodiments, the same reference numerals are given and detailed descriptions thereof are omitted.

In the second embodiment, as shown in FIG. 7, the first wiring 21 and the second wiring 22 partially have a generally letter L shape when viewed from the top. However, the shape of the first wiring 21 and the second wiring 22 when viewed from the top is not limited to the above-described shape.

In the fourth embodiment, as shown in FIG. 10, the first wiring 21 and the second wiring 22 partially have a generally straight line shape when viewed from the top.

The first wiring 21 has a generally straight line shape such that the longitudinal middle portion of the two linear portions 42 of the lower wiring 9 is passed through when viewed from the top.

The second wiring 22 has a generally straight line shape such that the longitudinal other end portion of the linear portion 42 positioned at longitudinal one side, and longitudinal one end portion of the linear portion 42 positioned at the longitudinal other side are passed through when viewed from the top.

The second wiring 22 has an inclined face overlapping avoidance portion 16 detouring the insulating inclined face curve portion 13.

The inclined face overlapping avoidance portion 16 has a depression that is depressed so as to avoid the inclined face overlapping avoidance portion 16 toward one side in the width direction at the width-direction-other end edge 36C in the second wiring 22 when viewed from the top.

The production method of the fourth embodiment is in accordance with the production method of the first embodiment.

With the fourth embodiment as well, the same operations and effects as those of the first embodiment can be achieved.

Fifth Embodiment

In the fifth embodiment, for those members and production steps that are the same as the first to fourth embodiments, the same reference numerals are given and detailed descriptions thereof are omitted.

In the first to fourth embodiments, as shown in FIG. 4D to FIG. 6J, a positive photoresist 23 is used to form the upper conductor pattern 5 by the additive method.

However, in the fifth embodiment, as shown in FIG. 11D to FIG. 13I, a negative photoresist 23 is used to form the upper conductor pattern 5 by the subtractive method.

The production method of the wired circuit board 1 in the fifth embodiment includes a step i (ref: FIG. 11A), in which an insulating base layer 2 is prepared; a step ii (ref: FIG. 11B), in which the lower conductor pattern 3 is provided on the top face of the insulating base layer 2; a step 1, in which (ref: FIG. 11C) the intermediate insulating layer 4 is provided on the top face of the insulating base layer 2 so as to cover the lower conductor pattern 3; and a step 2, in which (ref: FIG. 11D) a conductor layer 33 is provided on the top face of the intermediate insulating layer 4.

Figure 12E:
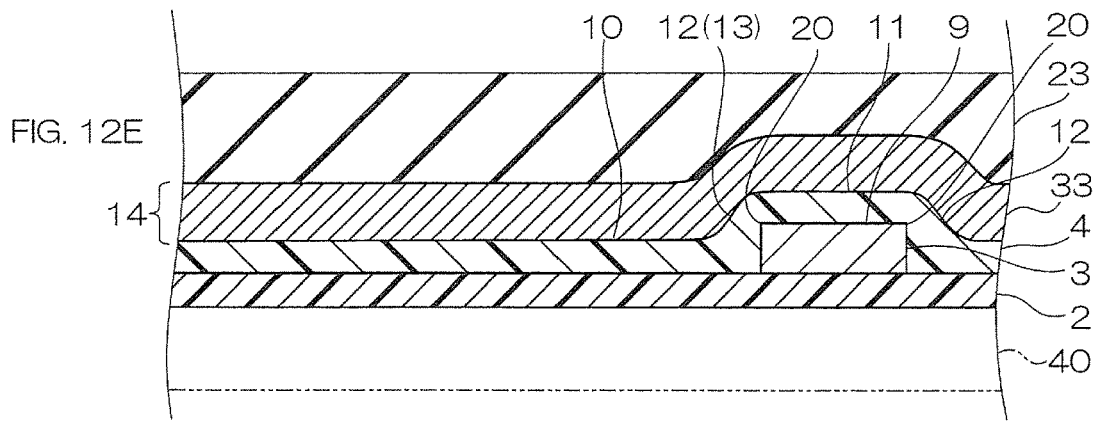
FIG. 12E to FIG. 12G show, following FIG. 11D, a portion of the process diagram for the method for producing a wired circuit board in the fifth embodiment of the present invention, FIG. 12E illustrating a step 3, in which a photoresist is provided on the top face of the conductor layer, and FIG. 12F illustrating a step 4, in which a photoresist is exposed to light, FIG. 12G illustrating a step 5, in which the conductor layer is allowed to expose from a first exposure portion and a second exposure portion.

The production method of the wired circuit board 1 further includes a step 3, in which (ref: FIG. 12E) the photoresist 23 is provided on the top face of the conductor layer 33; a step 4, in which (ref FIG. 12F) the photoresist 23 is exposed to light through a photomask 28; and a step 5, in which (ref: FIG. 12G) a portion other than the first exposure portion 24 corresponding to the first wiring 21 and the second exposure portion 25 corresponding to the second wiring 22 in the photoresist 23 is removed to allow the conductor layer 33 to expose from the first exposure portion 24 and the second exposure portion 25.

The production method of the wired circuit board 1 further includes a step 6 (ref: FIG. 13H) in which the conductor layer 33 exposed from the first exposure portion 24 and the second exposure portion 25 is removed to form an upper conductor pattern 5; a step iii (ref: FIG. 13I), in which the first exposure portion 24 and the second exposure portion 25 are removed; and a step v (ref: FIG. 13J), in which the insulating cover layer 6 is provided on the top face of the intermediate insulating layer 4 so as to cover the upper conductor pattern 5.

1. Step 1 and step 2

In the fifth embodiment, as shown in FIG. 11C and FIG. 11D, the step 1 and the step 2 are sequentially conducted. Alternatively, the step 1 and the step 2 are conducted, for example, simultaneously. To conduct the step I and the step 2 simultaneously, a two-layer substrate 14 in which the intermediate insulating layer 4 and the conductor layer 33 are laminated in advance is provided on the top face of the insulating base layer 2 so as to cover the lower conductor pattern 3.

The conductor layer 33 is provided on the entire top face including the first flat face 10, the second flat face 11, and the inclined face 12 of the intermediate insulating layer 4. The conductor layer 33 extends along the surface direction along the top face of the intermediate insulating layer 4. The conductor layer 33 is made of the same conductive material as that of the upper conductor pattern 5. The conductor layer 33 has a thickness that is the same as the thickness of the upper conductor pattern 5. The conductor layer 33 has a surface reflectivity for light having a wavelength of 400 nm at an angle of incidence of 45 degrees of for example, 15% or more, preferably 20% or more, more preferably 30% or more, and for example, 60% or less. The surface reflectivity is calculated in conformity with the method described in, for example, JIS Z 8741 (1997). When the conductor layer 33 has a surface reflectivity of below the above-described lower limit, the incident light B' in the assumption to be described later is not generated, and the problem in the of the present invention may be absent.

2. Step 4

Figure 12F:
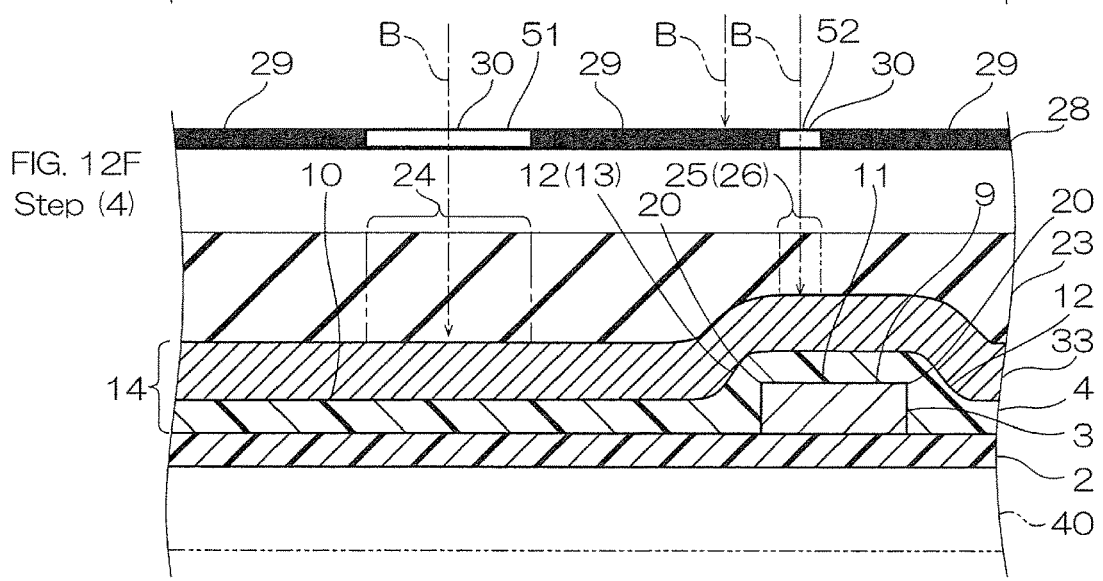
Figure 12G:
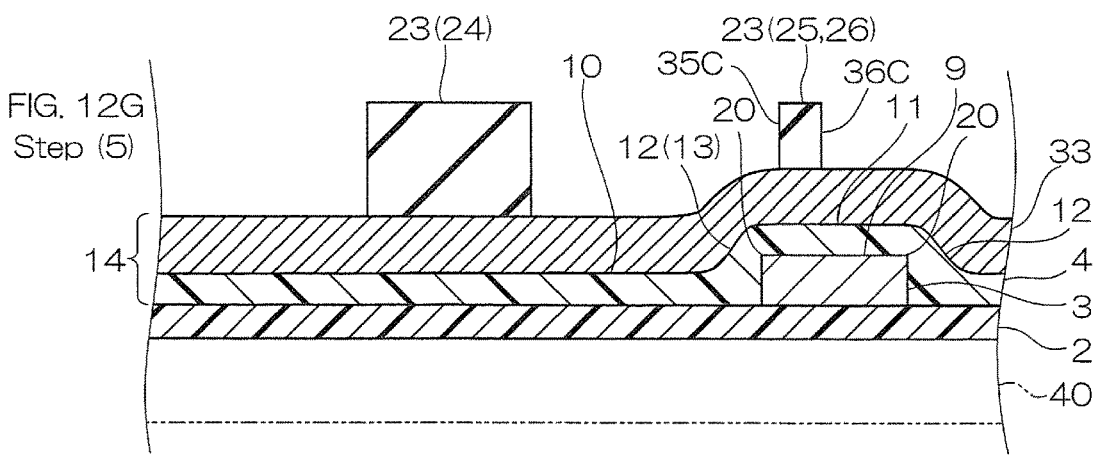
Figure 14:
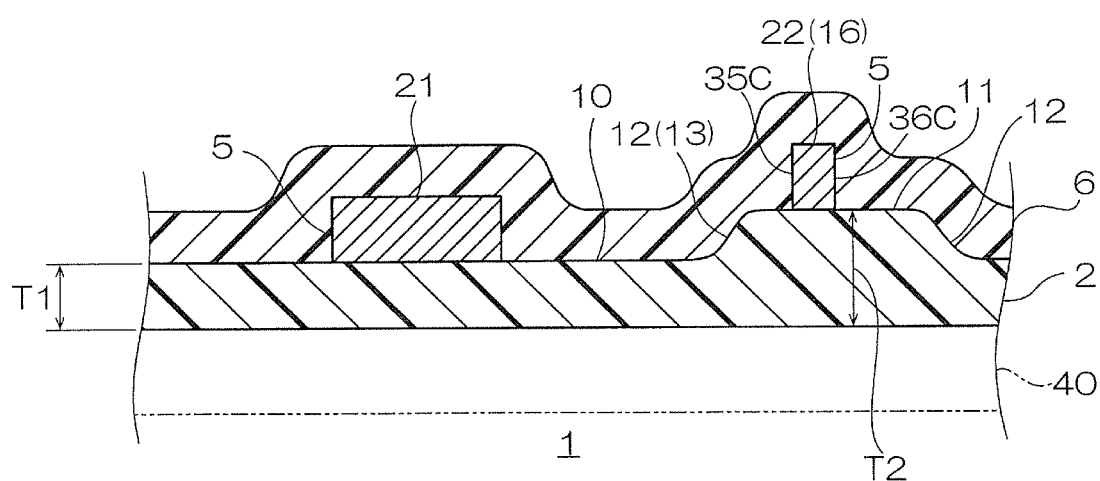
FIG. 14 shows a cross-sectional view of a modified example of the wired circuit board produced in the first to fifth embodiments (embodiment in which the lower conductor pattern and the intermediate insulating layer are not provided).

As shown in FIG. 12F, in the step 4, the photomask 28 is disposed above the photoresist 23.

The photoresist 23 is a negative type photoresist (negative photoresist). The negative type photoresist is a resist that allows the portion to which (a predetermined amount or more of light) light is applied at the time of exposure to be remained in developing thereafter, and meanwhile, the portion which is shielded from light at the time of exposure (portion to which light is not applied, to be specific, portion to which less than the predetermined amount of light is applied) to be removed in developing thereafter.

Thereafter, as shown in the arrow in FIG. 12F, the photoresist 23 is exposed to light through the photomask 28.

The light B applied to the light-shield-portion 29 between the first light transmissive portion 51 and the second light transmissive portion 52 is shielded by the light-shield-portion 29, and does not reach the photoresist 23. Therefore, light B is positioned below the above-described photoresist 23, and does not reach the conductor layer 33 facing the insulating inclined face curve portion 13.

Therefore, the reflected light B' (ref: FIG. 15 and FIG. 18A) to be described later is not produced.

3. Step 5

As shown in FIG. 12G, in the step 5, the photoresist 23 after exposure to light is developed, for example, with a developer, and the portion other than the first exposure portion 24 and the second exposure portion 25 is removed and the first exposure portion 24 and the second exposure portion 25 are remained.

4. Step 6

As shown in FIG. 13H, in the step 6, the conductor layer 33 exposed from the first exposure portion 24 and the second exposure portion 25 (photoresist 23 after development) is removed.

For example, the first exposure portion 24 and the second exposure portion 25 are used as an etching resist, and the conductor layer 33 exposed from the first exposure portion 24 and the second exposure portion 25 is subjected to etching.

In this manner, an upper conductor pattern 5 having the first wiring 21, the second wiring 22, and the second terminal (not shown) is formed.

5. Step iii

As shown in FIG. 13I, in the step iii, the first exposure portion 24 and the second exposure portion 25 are removed, for example, by peeling.

6. Wired Circuit Board

The wired circuit board 1 obtained by the production method of the fifth embodiment includes, as shown in FIG. 13J, the insulating base layer 2, the lower conductor pattern 3, the intermediate insulating layer 4, the upper conductor pattern 5, and the insulating cover layer 6. The wired circuit board 1 of the fifth embodiment does not include, unlike the wired circuit board 1 of the first to fourth embodiments, the metal thin film 33 (ref: FIG. 6K).

Meanwhile, the wired circuit board 1 of the fifth embodiment may include an adhesive layer (not shown) between the upper conductor pattern 5 and the intermediate insulating layer 4.

7.

A. Light Focus (Assumption)

The following assumption is considered: As shown in FIG. 15, a wired circuit board 1 in which the second wiring 22 has no inclined face overlapping avoidance portion 16 (ref: FIG. 1) is produced. In this assumption as well, the step 4 shown in FIG. 18A, the step 5 shown in FIG. 18B, and step 6 shown in FIG. 18C are sequentially conducted.

As shown in FIG. 18A, in the step 4, the photoresist 23 is exposed to light through the photomask 28. In particular, the light B that passed through the second light transmissive portion 52 reaches the photoresist 23 and enters into the photoresist 23, and thereafter the portion thereof produces the reflected light B' at the conductor layer 33 corresponding to the insulating inclined face curve portion 13. The reflected light B' passes through the photoresist 23 obliquely upward and one side in the width direction, and reaches the assumedly remained portion 46 of the photoresist 23 when viewed in cross section.

Furthermore, as shown in the arrow of FIG. 15, the reflected light B' produced at the conductor layer 33 corresponding to the insulating inclined face curve portion 13 focuses on the center (center of the arc portion 41) C of the virtual circle along the insulating inclined face curve portion 13 when viewed from the top. That is, when viewed from the top, the conductor layer 33 corresponding to the insulating inclined face curve portion 13 works as a concave lens, and the reflected light B' is focused on the point of the center C. Therefore, the amount of light that at the assumedly remained portion 46 including the center C and its vicinity is relatively high. To be specific, the amount of light at the assumedly remained portion 46 is the amount of light that allows the assumedly remained portion 46 to remain in the step 5, or even more. The boundary light amount is a boundary value that causes the assumedly remained portion 46 to remain when the amount of light is the boundary value or more, and the assumedly remained portion 46 to be removed when the amount of light is below the boundary value.

Then, in the step 5, as shown in the phantom line of FIG. 18B, although the assumedly remained portion 46 is to be removed, as shown in the solid line of FIG. 18B, the assumedly remained portion 46 is not removed, that is, the assumedly remained portion 46 remains (produces (forms) the assumedly remained portion 46).

Meanwhile, in the step 4, sufficient amount of light passing through the first light transmissive portion 51 and the second light transmissive portion 52 reaches the first exposure portion 24 corresponding to the first light transmissive portion 51 and the second exposure portion 25 corresponding to the second light transmissive portion 52, and therefore, in the step 5, the first exposure portion 24 and the second exposure portion 25 remain.

Meanwhile, the portion other than the assumedly remained portion 46, the first exposure portion 24, and the second exposure portion 25 is removed.

That is, in the step 5, the assumedly remained portion 46 connects the first exposure portion 24 and the second exposure portion 25.

Then, in the step 6, when the conductor layer 33 exposed from the photoresist 23 is removed to form the upper conductor pattern 5, as shown in FIG. 17 and FIG. 18C, other than the first wiring 21 and the second wiring 22, a short circuit portion 45 connecting them and covered by the assumedly remained portion 46 is unintendedly provided. The short circuit portion 45 has the same pattern as that of the assumedly remained portion 46 when viewed from the top. The short circuit portion 45 connects the first wiring 21 and the second wiring 22. The short circuit portion 45 has a generally circular shape when viewed from the top with the above-described center C as the center.

That is, the upper conductor pattern 5 is a defective pattern having the short circuit portion 45.

B. Fifth Embodiment with No Light Focus

However, with the production method of the fifth embodiment, as shown in FIG. 1 and FIG. 12F, the second exposure portion 25 has an avoidance portion 26 that avoids the insulating inclined face curve portion 13 when viewed from the top. Then, in the step 4, even if the photoresist 23 is exposed to light so as to shield the photoresist 23 corresponding to the insulating inclined face curve portion 13 through the photomask 28, the reflected light B' (ref: FIG. 15 and FIG. 18A) reflected at the conductor layer 33 corresponding to the insulating inclined face curve portion 13 is not produced. Therefore, as shown in FIG. 12G, in the step 5, production of the assumedly remained portion 46 caused by the above-described light focus can be prevented. As a result, as shown in FIG. 13H, in the step 6, formation of the short circuit portion 45 can be prevented. That is, the short circuit between the first wiring 21 and the second wiring 22 can be prevented. That is, the defective pattern in the upper conductor pattern 5 can be prevented.

With the production method of the fifth embodiment, as long as the second exposure portion 25 includes the avoidance portion 26 and the overlapping portion 27, the second wiring 22 can be provided highly freely.

Modified Example of Fifth Embodiment

The shape of the upper conductor pattern 5 (first light transmissive portion 51 and second light transmissive portion 52)(first exposure portion 24 and second exposure portion 25) when viewed from the top can be the shapes given as examples in the second to fourth embodiments when viewed from the top. Such a modified example can also achieve the operations and effects of the fifth embodiment.

Modified Example of First to Fifth Embodiments

In the first to fifth embodiments, as shown in FIG. 1, the insulating inclined face curve portion 13 as an example of the bending portion has an arc shape when viewed from the top.

However, the shape viewed from the top is not limited thereto as long as the insulating inclined face curve portion 13 generates light focus caused by the reflected light B' as shown in the arrows in FIG. 15 and FIG. 16A (or FIG. 18A) to produce the assumedly removed portion 31 (or assumedly remained portion 46). The insulating inclined face curve portion 13 can be, for example, although not shown, a curved shape with its center point continuously moving when viewed from the top.

Although the wired circuit board 1 is given as an example of the wired circuit board produced by method of the present invention, it is not limited thereto, and as shown by the phantom line in FIG. 2 and FIG. 3, it can be a suspension board with circuit including the metal supporting board 40. In such a case, the suspension board with circuit includes the metal supporting board 40, the insulating base layer 2, the lower conductor pattern 3, the intermediate insulating layer 4, the upper conductor pattern 5, and the insulating cover layer 6.

As shown in FIG. 2, in the wired circuit board 1 produced in the first to fifth embodiments, the top face of the intermediate insulating layer 4 has a second flat face 11, but for example, although not shown, the inclined face 12 will suffice, and the second flat face 11 does not have to be included.

The inclined face 12 of the intermediate insulating layer 5 of the wired circuit board 1 produced in first to fifth embodiments is in correspondence with the ridgeline portion 20 of the lower wiring 9. However, for example, although not shown, as shown in FIG. 18, the insulating base layer 2 can have an inclined face 12 such as the following: the inclined face 12 does not correspond to the lower conductor pattern 3, but simply the insulating layer as an example of the insulating base layer 2 has a plurality of thicknesses T1 and T2. The thickness T1 is the thickness of the insulating base layer 2 of the first flat face 10. Meanwhile, the thickness T2 is the thickness of the insulating base layer 2 at the second flat face 11. The thickness T2 is thicker than the thickness T1.

The lower conductor pattern 3 includes, as shown in FIG. 1, the lower wiring 9, but for example, although not shown, it can also include other wirings as well.

The upper conductor pattern 5 includes, as shown in FIG. 1, the first wiring 21 and the second wiring 22, but for example, although not shown, it can also include other wirings as well.

While the illustrative embodiments of the present invention are provided in the above description, such is for illustrative purpose only and it is not to be construed as limiting in any manner. Modifications and variations of the present invention that will be obvious to those skilled in the art are to be covered by the following claims.

The invention claimed is:

1. A method for producing a wired circuit board including an insulating layer, and a first wiring and a second wiring next to each other in spaced-apart relation, the method including the steps of:

a step 1, in which the insulating layer having an inclined face is provided, a step 2, in which a metal thin film is provided on the surface of the insulating layer, a step 3, in which a photoresist is provided on the surface of the metal thin film, a step 4, in which a photomask is disposed so that in the photoresist, a first exposure portion corresponding to the first wiring and a second exposure portion corresponding to the second wiring are exposed to light, and the photoresist is exposed to light through the photomask, a step 5, in which the first exposure portion and the second exposure portion of the photoresist are removed to allow the metal thin film corresponding to the first exposure portion and the second exposure portion to expose, and a step 6, in which the first wiring and the second wiring are provided on the surface of the metal thin film, wherein on the assumption that in the step 4, the reflected light reflected at the metal thin film is focused between the first exposure portion and the second exposure portion of the photoresist, the inclined face has a bending portion bending in one direction when viewed from the top, such that the portion removed in the step 5 in the photoresist due to light focus is continuous with the first exposure portion and the second exposure portion, and the second exposure portion includes continuously an avoidance portion that avoids the bending portion and an overlapping portion that overlaps with at least a portion other than the bending portion in the inclined face when viewed from the top.

* * * * *